(12) United States Patent
Patton et al.

(10) Patent No.: US 10,678,815 B2
(45) Date of Patent: Jun. 9, 2020

(54) DYNAMIC EVENT DETECTION SYSTEM AND METHOD

(71) Applicant: Banjo, Inc., Redwood City, CA (US)

(72) Inventors: Damien Patton, Redwood City, CA (US); Rish Mehta, Redwood City, CA (US); Pedro Alves, Redwood City, CA (US)

(73) Assignee: Banjo, Inc., South Jordan, UT (US)

(*) Notice: Subject to any disclaimer, the term of this patent is extended or adjusted under 35 U.S.C. 154(b) by 636 days.

(21) Appl. No.: 15/486,978

(22) Filed: Apr. 13, 2017

(65) Prior Publication Data

US 2017/0220668 A1 Aug. 3, 2017

Related U.S. Application Data

(63) Continuation of application No. 14/643,958, filed on Mar. 10, 2015, now Pat. No. 9,652,525, which is a
(Continued)

(51) Int. Cl.
*G06F 16/28* (2019.01)
*G06F 16/27* (2019.01)
(Continued)

(52) U.S. Cl.
CPC ............ *G06F 16/285* (2019.01); *G06F 16/27* (2019.01); *G06F 16/29* (2019.01); *G06F 16/48* (2019.01);
(Continued)

(58) Field of Classification Search
CPC ........ G06F 16/285; G06F 16/27; G06F 16/29; G06F 16/48; G06F 16/487; G06F 16/951;
(Continued)

(56) References Cited

U.S. PATENT DOCUMENTS 6,542,749 B2 4/2003 Tanaka et al.
6,542,750 B2 4/2003 Hendrey et al.
(Continued)

FOREIGN PATENT DOCUMENTS

| WO | 075594 | 9/2004 |
|---|---|---|
| WO | 043946 | 4/2011 |
| WO | 109488 | 8/2012 |

OTHER PUBLICATIONS

Office Action received in U.S. Appl. No. 13/491,363, dated Oct. 11, 2012, 13 pages.
(Continued)

*Primary Examiner* — Shahid A Alam
(74) *Attorney, Agent, or Firm* — Michael B. Dodd; R. Jace Hirschi

(57) ABSTRACT

A method for dynamic event detection based on content from a set of social networking systems including receiving content from the set of social networking systems, identifying a plurality of content associated with a geofence, the content that was generated within a predetermined time period, determining feature values from the plurality of content for each of a set of features, determining an event probability for the geofence based on the feature values, and detecting an event within the geofence in response to the event probability exceeding a threshold event probability.

19 Claims, 11 Drawing Sheets

Related U.S. Application Data continuation-in-part of application No. 14/574,966, filed on Dec. 18, 2014, now Pat. No. 9,043,329, application No. 15/486,978, filed on Apr. 13, 2017, which is a continuation of application No. 14/643,958, filed on Mar. 10, 2015, now Pat. No. 9,652,525, which is a continuation-in-part of application No. 14/501,436, filed on Sep. 30, 2014, now abandoned, which is a continuation-in-part of application No. 14/043,479, filed on Oct. 1, 2013, now abandoned, application No. 15/486,978, filed on Apr. 13, 2017, which is a continuation of application No. 14/643,958, filed on Mar. 10, 2015, now Pat. No. 9,652,525, which is a continuation-in-part of application No. 14/501,436, filed on Sep. 30, 2014, now abandoned.

(60) Provisional application No. 62/060,407, filed on Oct. 6, 2014, provisional application No. 61/709,103, filed on Oct. 2, 2012, provisional application No. 61/782,687, filed on Mar. 14, 2013, provisional application No. 61/784,809, filed on Mar. 14, 2013, provisional application No. 61/885,322, filed on Oct. 1, 2013, provisional application No. 61/918,126, filed on Dec. 19, 2013, provisional application No. 62/006,632, filed on Jun. 2, 2014.

(51) Int. Cl.
*G06F 16/29* (2019.01)
*H04W 4/021* (2018.01)
*H04W 4/21* (2018.01)
*G06F 16/48* (2019.01)
*G06F 16/487* (2019.01)
*G06F 16/951* (2019.01)
*G06F 16/58* (2019.01)
*G06F 16/9535* (2019.01)
*G06F 16/9537* (2019.01)

(52) U.S. Cl.
CPC .......... *G06F 16/487* (2019.01); *G06F 16/489* (2019.01); *G06F 16/5866* (2019.01); *G06F 16/951* (2019.01); *G06F 16/9535* (2019.01); *G06F 16/9537* (2019.01); *H04W 4/021* (2013.01); *H04W 4/21* (2018.02)

(58) Field of Classification Search
CPC ............ G06F 16/5866; G06F 16/9535; G06F 16/9537; G06F 16/489
USPC ........................................................ 707/740
See application file for complete search history.

(56) References Cited

U.S. PATENT DOCUMENTS

| | | |
|---|---|---|
| 6,618,593 B1 | 9/2003 | Drutman et al. |
| 6,771,970 B1 | 8/2004 | Dan |
| 6,944,443 B2 | 9/2005 | Bates et al. |
| 7,069,016 B2 | 6/2006 | Crisler et al. |
| 7,107,447 B2 | 9/2006 | Sanin et al. |
| 7,437,444 B2 | 10/2008 | Houri |
| 7,478,157 B2 | 1/2009 | Bohrer et al. |
| 7,614,002 B2 | 11/2009 | Goldfeder et al. |
| 7,711,781 B2 | 5/2010 | Davis et al. |
| 7,765,176 B2 | 7/2010 | Simmons et al. |
| 7,844,254 B2 | 11/2010 | Arnold et al. |
| 7,849,204 B2 | 12/2010 | Yared et al. |
| 7,908,647 B1 | 3/2011 | Polis et al. |
| 7,917,154 B2 | 3/2011 | Fortescue et al. |
| 7,917,594 B2 | 3/2011 | Reding et al. |
| 7,962,852 B2 | 6/2011 | Tagami et al. |
| 7,996,464 B1 | 8/2011 | Wang et al. |
| 8,005,703 B2 | 8/2011 | Chakra et al. |
| 8,046,003 B2 | 10/2011 | Lovell, Jr. |
| 8,046,418 B1 | 10/2011 | Denise |
| 8,065,257 B2 | 11/2011 | Kuecuekyan |
| 8,069,186 B2 | 11/2011 | Farnham et al. |
| 8,103,741 B2 | 1/2012 | Frazier et al. |
| 8,117,281 B2 | 2/2012 | Robinson et al. |
| 8,122,516 B2 | 2/2012 | Cuellar et al. |
| 8,140,570 B2 | 3/2012 | Ingrassia et al. |
| 8,150,798 B2 | 4/2012 | Ma et al. |
| 8,155,669 B2 | 4/2012 | Ziskind et al. |
| 8,165,604 B2 | 4/2012 | Ziskind et al. |
| 8,225,376 B2 | 7/2012 | Zuckerberg et al. |
| 8,248,404 B2 | 8/2012 | Hamilton, II et al. |
| 8,311,973 B1 | 11/2012 | Zadeh et al. |
| 8,312,380 B2 | 11/2012 | Churchill et al. |
| 8,321,508 B2 | 11/2012 | Lingafelt et al. |
| 8,327,451 B2 | 12/2012 | Duri et al. |
| 8,331,958 B2 | 12/2012 | Hein et al. |
| 8,341,207 B2 | 12/2012 | Werner et al. |
| 8,347,317 B1 | 1/2013 | Balaji et al. |
| 8,396,490 B2 | 3/2013 | Platt et al. |
| 8,447,852 B1 | 5/2013 | Penumaka et al. |
| 8,484,224 B1 | 7/2013 | Harris et al. |
| 8,484,241 B2 | 7/2013 | Bouse et al. |
| 8,489,127 B2 | 7/2013 | Huang et al. |
| 8,504,061 B2 | 8/2013 | Grainger et al. |
| 8,510,383 B2 | 8/2013 | Hurley et al. |
| 8,554,784 B2 | 10/2013 | Nurminen et al. |
| 8,655,873 B2 | 2/2014 | Mitchell et al. |
| 8,731,813 B2 | 5/2014 | Sheha et al. |
| 8,756,178 B1 | 6/2014 | Bruckhaus et al. |
| 8,762,285 B2 | 6/2014 | Davis et al. |
| 8,775,570 B2 | 7/2014 | Sandholm |
| 8,856,237 B2 | 10/2014 | Spataro et al. |
| 8,863,262 B2 | 10/2014 | Samatov |
| 8,930,234 B2 | 1/2015 | Spears et al. |
| 8,934,661 B2 | 1/2015 | Dolson et al. |
| 8,941,489 B2 | 1/2015 | Sheshadri et al. |
| 8,943,054 B2 | 1/2015 | Caruso et al. |
| 8,943,135 B2 | 1/2015 | Johnmar et al. |
| 8,989,778 B2 | 3/2015 | Altman et al. |
| 9,122,693 B2 | 9/2015 | Blom et al. |
| 9,123,028 B2 | 9/2015 | Olsen |
| 9,141,656 B2 | 9/2015 | Lopyrev et al. |
| 9,143,601 B2 | 9/2015 | Padmanabhan et al. |
| 9,239,958 B2 | 1/2016 | Deng et al. |
| 9,256,685 B2 | 2/2016 | Zamir et al. |
| 9,262,517 B2 | 2/2016 | Feng et al. |
| 9,330,183 B2 | 5/2016 | Woss et al. |
| 9,460,474 B2 | 10/2016 | Grignon |
| 9,621,600 B2 | 4/2017 | Yu et al. |
| 9,646,025 B2 | 5/2017 | Boyns et al. |
| 2003/0037110 A1 | 2/2003 | Yamamoto |
| 2004/0075752 A1 | 4/2004 | Valleriano et al. |
| 2008/0114835 A1 | 5/2008 | Mu et al. |
| 2008/0228695 A1 | 9/2008 | Sifry et al. |
| 2009/0064144 A1 | 3/2009 | Abhyanker |
| 2010/0125605 A1 | 5/2010 | Nair et al. |
| 2010/0203901 A1 | 8/2010 | Dinoff et al. |
| 2011/0035264 A1 | 2/2011 | Zaloom et al. |
| 2011/0161987 A1 | 6/2011 | Huang et al. |
| 2011/0218946 A1 | 9/2011 | Stern et al. |
| 2011/0230161 A1 | 9/2011 | Newman |
| 2012/0166964 A1 | 6/2012 | Tseng |
| 2013/0035983 A1 | 2/2013 | Kursar et al. |
| 2013/0073473 A1 | 3/2013 | Heath et al. |
| 2013/0129142 A1 | 5/2013 | Miranda-Steiner |
| 2013/0225196 A1 | 8/2013 | James et al. |
| 2014/0089775 A1 | 3/2014 | Worsley et al. |
| 2014/0149846 A1 | 5/2014 | Ansel et al. |
| 2014/0201126 A1 | 7/2014 | Zadeh et al. |
| 2014/0207865 A1 | 7/2014 | Carr et al. |
| 2014/0222704 A1 | 8/2014 | Abhyanker |
| 2015/0006333 A1 | 1/2015 | Silveira et al. |
| 2016/0103903 A1 | 4/2016 | Vivalda et al. |

(56) References Cited

U.S. PATENT DOCUMENTS

2016/0196584 A1 7/2016 Franklin et al.
2017/0228384 A1 8/2017 Caruso et al.

OTHER PUBLICATIONS

Office Action received in U.S. Appl. No. 14/574,966, dated Feb. 12, 2015, 23 pages.
Office Action received in U.S. Appl. No. 14/643,958, dated Jul. 18, 2016, 22 pages.
Office Action received in U.S. Appl. No. 14/971,607, dated Sep. 23, 2016, 7 pages.
Office Action received in U.S. Appl. No. 14/971,607, dated Apr. 29, 2016, 18 pages.
Office Action received in U.S. Appl. No. 15/250,735, dated May 8, 2017, 16 pages.
Office Action received in U.S. Appl. No. 15/479,723, dated Jun. 22, 2017, 11 pages.
Espinoza et al. "GeoNotes: Social and Navigational Aspects of Location-Based Information Systems," 2001, Ubicomp2001, LNC2201, pp. 2-17.
Karimi, Hassan A., et al. "SoNavNet: a framework for social navigation networks." Proceedings of the 2009 International Workshop on Location Based Social Networks. ACM, 2009.
Lee et al. (Discovery of unusual regional social activities using geo-tagged microblogs, World Wide Web (2011) 14:321-349, Published online: Mar. 1, 2011).
Liu et al. (Using Social Media to Identify Events, WSM'11, Nov. 30, 2011, 6 pages).
Paul (Tutorial: consuming Twitter's real time stream API in Python, Apr. 21, 2010 5:45pm UTC, 4 pages).
Yang et al. (A Language for Automatically Enforcing Privacy Policies, POPL'12=, Jan. 25-27, 2012, 13 pages).

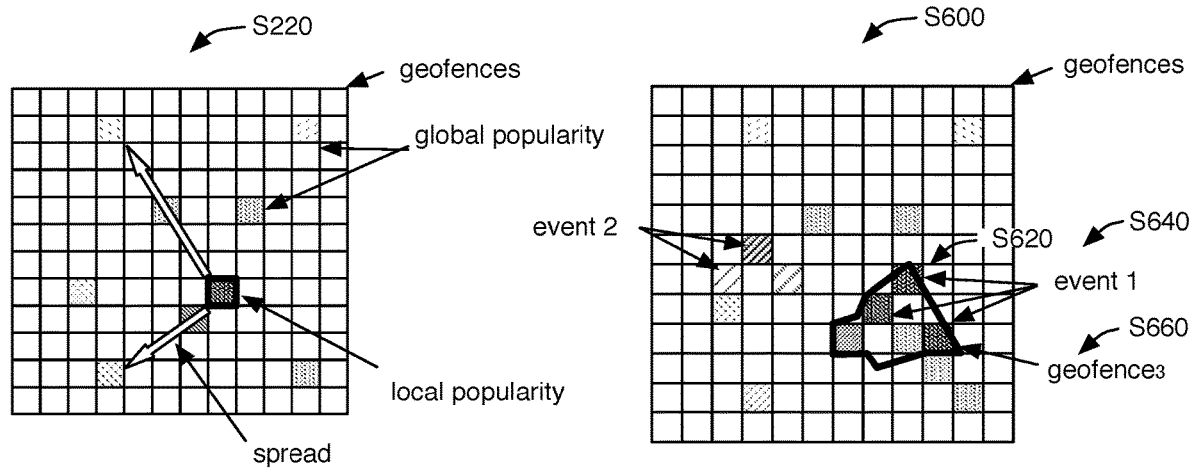
FIGURE 15
FIGURE 16
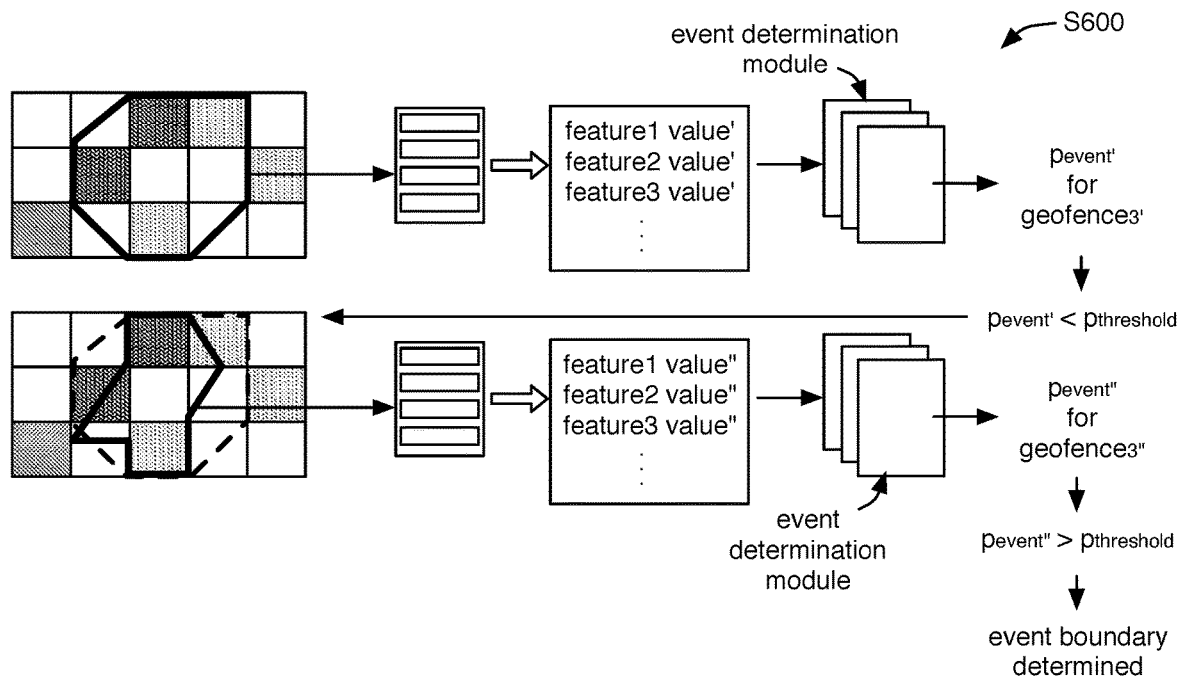
FIGURE 17

DYNAMIC EVENT DETECTION SYSTEM AND METHOD

CROSS-REFERENCE TO RELATED APPLICATIONS

This application is a continuation of U.S. application Ser. No. 14/643,958, filed 10 Mar. 2015, which is a continuation-in-part of U.S. application Ser. No. 14/574,966 filed 18 Dec. 2014, which claims the benefit of U.S. Provisional Application No. 61/918,126, filed 19 Dec. 2013, U.S. Provisional Application No. 62/060,407, filed 6 Oct. 2014, and U.S. Provisional Application No. 62/006,632, filed 2 Jun. 2014. This application is a continuation of U.S. application Ser. No. 14/643,958, filed 10 Mar. 2015, which is also a continuation-in-part of application U.S. application Ser. No. 14/501,436, filed 30 Sep. 2014, which is a continuation-in-part of application Ser. No. 14/043,479, filed 1 Oct. 2013, which claims the benefit of U.S. Provisional Application No. 61/709,103, filed 2 Oct. 2012, U.S. Provisional Application No. 61/782,687, filed 14 Mar. 2013, and U.S. Provisional Application No. 61/784,809, filed 14 Mar. 2013. This application is a continuation of U.S. application Ser. No. 14/643,958, filed 10 Mar. 2015, which is a continuation-in-part of U.S. application Ser. No. 14/574,966 filed 18 Dec. 2014, which is a continuation-in-part of U.S. application Ser. No. 14/501,436, filed 30 Sep. 2014, which also claims the benefit of U.S. Provisional Application No. 61/885,322, filed 1 Oct. 2013, U.S. Provisional Application No. 61/918,126, filed 19 Dec. 2013, and U.S. Provisional Application No. 62/006,632, filed 2 Jun. 2014. All of the aforementioned applications are incorporated herein in their entireties by this reference.

TECHNICAL FIELD

This invention relates generally to the social media field, and more specifically to a new and useful system and method of dynamic event detection in the social media field.

BACKGROUND

Social networking services provide a rich source of data for real-time event detection, particularly with the increased popularity of posting geotagged content from mobile devices in real time. However, there are several problems posed by using social networking service content to detect events in real-time. First, the sheer volume and frequency of content generated across each social networking service is immense-attempting to analyze all the content generated across multiple social networking services in real time poses considerable processing and modeling challenges. Second, the social networking service content is typically a mix of content with different focuses, ranging from content that is relevant to an event (e.g., an image of the event focus) to content that is irrelevant to an event (e.g., content that is only relevant to the user or the personal connections of the user), distributed across time and space. The volume of secondary content (e.g., content that is not about the event) tends to eclipse the primary content (e.g., content that is about the event), rendering detection of the beginning of an event difficult. Third, curation of the content relevant to the event poses an issue as well, as the event-associated content can range from content about the event focus to content about spectators of the event. For example, content about the event focus can be relevant to users interested about the event, while content about the event spectators tends to be irrelevant to the users and dilutes the value of an event feed that is generated from the event-associated content. Conversely, some entities can be interested in only the content generated by spectators of the event (e.g., a sporting event or music event), while content about the event itself is irrelevant to the entity and dilutes the value of the content feed generated from the event- or geographic region-associated content. The substantially real-time event detection can subsequently be used to notify users, used as a trigger event for trading models or trading triggers in financial market applications, or used in any other suitable manner.

Thus, there is a need in the social networking services field to create a new and useful system and method for automatic, real-time event detection based on content generated on social networking systems.

BRIEF DESCRIPTION OF THE FIGURES

FIG. 15 is a schematic representation of local popularity, global popularity, and spread.

FIG. 16 is a schematic representation of a first variation of determining the geographic extent of an event based on geofence event probabilities.

FIG. 17 is a schematic representation of a second variation of determining the geographic extent of an event based on the content plurality associated with the event geofence.

DESCRIPTION OF THE PREFERRED EMBODIMENTS

The following description of the preferred embodiments of the invention is not intended to limit the invention to these preferred embodiments, but rather to enable any person skilled in the art to make and use this invention.

Figure 1:
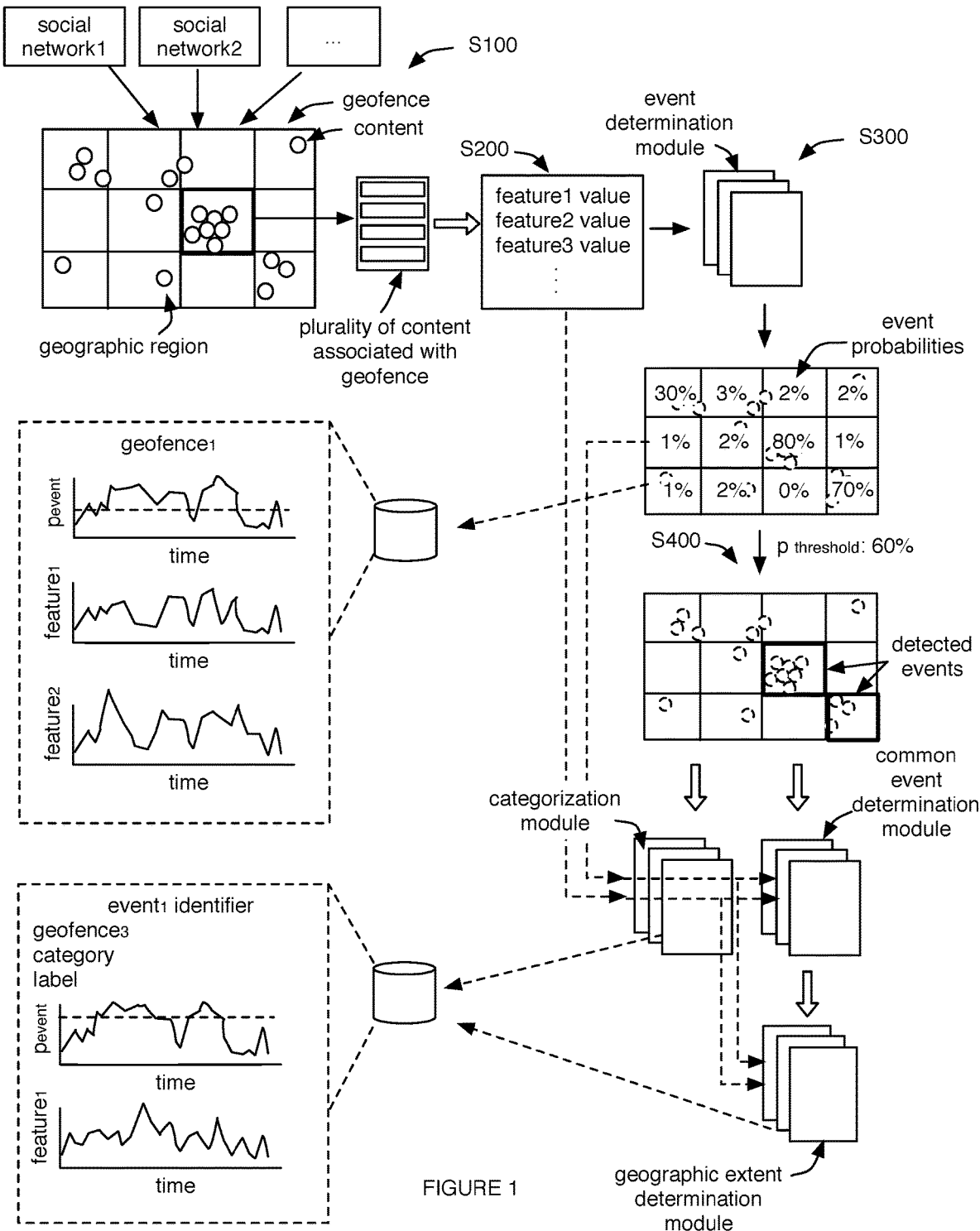
FIG. 1 is a schematic representation of an example of the method of dynamic event detection.

As shown in FIG. 1, the system and method of dynamic event detection includes receiving content associated with a set of geofences S100, determining a set of feature values for each of the set of geofences S200, and determining an event probability for the respective geofence based on the set of feature values S300. The method can additionally include analyzing feature values for adjacent geofences in response to a geofence event probability exceeding a threshold probability to determine the geographic extent of the event. The method can additionally include determining a characterization for the event, determine whether the event is of interest to a specific entity, or determine any other suitable information.

The method functions to automatically determine the probability that an event is occurring within a predetermined geofence, in real time or in near-real time. The method preferably does so without reference to a scheduling database, and does not require data regarding a previously scheduled event. However, the method can determine the event based on predetermined event information (e.g., a scheduled or known event), or determine the event or event probability in any other suitable manner.

The method confers several benefits over conventional event detection methods. First, the method leverages social networking system content generated by users in real- or near-real time, such that events can be dynamically determined whether or not the event was pre-scheduled. Second, by determining values for a plurality of features from the geofence content, the method enables rich contextualization of the event. Third, by dynamically selecting the number of features that are considered by each processing module (model), the method expedites event determination, categorization, or any other suitable event parameter determination. Fourth, by focusing on patterns, this method presents a more refined and accurate method of dynamically detecting events in real- or near-real time. The patterns can be considered in lieu of or in addition to parameter value averages (which rarely occur when considering content parameters in real-time).

The method can be performed in whole or in part by an event detection system supported by a computing system. The method can be performed by a native application on a user device, by a set of servers, by a browser application on a user device, or by any other suitable computing system. The computing systems can be stateless, stateful, or have any other suitable configuration or property. The computing system preferably receives the content from and/or sends information to a remote secondary computing system associated with a social networking system, but can alternatively communicate with a user device or any other suitable computing system.

The content (i.e., electronic messages, posts, content, persistent content, persistent data, persistent posts, etc.) can include URLs, links, references, text, images, video clips, audio clips, and/or any other suitable content. The content can additionally include metadata (i.e., an associated set of data properties). The metadata can include a timestamp, a geographic location (e.g., geotag, GPS coordinates, name of geographic location, etc.), a measure of location precision (e.g., radius of uncertainty), a categorization or identifier for the mobile device generating the content, a user account identifier, the content capture mechanism (e.g., front camera or back camera), or any other suitable parameter. The metadata is preferably representative of the respective parameters at the time of content creation or at the time the content was sent to the social networking system. The metadata is preferably associated with the content at the time of content generation (e.g., when the content is created or when the content is sent to the social networking system), but can alternatively be associated with the content after social networking system receipt. While the content preferably includes information for all available parameters, the content can alternatively lack information for some parameters, such as location information. The content can lack the parameter information due to a user preference restriction, due to the settings of the social networking system (e.g., wherein the social networking system does not associate location information with content), or for any other suitable reason. The content metadata can be associated with the content by the user device creating the content, by the user account controlling creation of the content, by a secondary user account, by the social networking system receiving the content, by the computing system as part of the method, or associated with the content in any other suitable manner.

Alternatively or additionally, the content can be associated with a time, location, or any other suitable parameter from the contents of the electronic message. For example, a geographic location can be determined for and associated with the piece of content in the manner disclosed in Ser. No. 14/043,479 filed 1 Oct. 2013, incorporated in its entirety by this reference. However, any other suitable information can be determined and/or associated with the content in any other suitable manner. In another example, the content can include a textual reference to an event (e.g., through an event name, URL, or other suitable event identifier or reference), wherein the content can be associated with a known event time and event location associated with the event. In another example, an image can be processed to extract location or time-related metadata (e.g., exchangeable image file format data), extract a location from the image content (e.g., by image matching with a database), extract a location tag, or extract any other suitable information. In another example, the content can include text that references a location (e.g., a location name) and/or a time (e.g., a date, a time, a duration from the time of content generation, etc.), wherein the referenced location and/or time are the associated location and/or time. In another example, the content can reference a secondary source (e.g., a secondary user account), wherein content authored by the secondary user account includes a location and/or a time. The location and/or time associated with the primary content can be the referenced location and/or time found in the content authored by the secondary user account.

The content is preferably generated by a user at a user device, wherein the user device sends the content to the remote computing system or the secondary remote computing system. However, the content can be generated by any other suitable system. The user device can include one or more server computers, desktop computers, laptop computers, notebook computers, sub-notebook computers, netbook computers, netpad computers, set-top computers, handheld computers, Internet appliances, mobile smartphones, tablet computers, personal digital assistants, video game consoles, vehicles, televisions, video players, tablets, or any other suitable user device. The devices can be stand-alone or networked. The device is preferably connected to the remote computing system (e.g., a server system, cloud computing system, distributed computing system, mesh network, database, etc.), but can alternatively be connected to any other suitable system. The device can be wirelessly connected to the remote computing system by a long range wireless connection, such as WiFi, a cellular network service, or any other suitable long range wireless connection, or be connected by a short range connection, such as radiofrequency, Bluetooth, near field, or any other suitable short range communication connection. Alternatively, the device can be connected to the computing system by a wired connection, such as a LAN line. The device can include a storage and/or memory device. The storage and/or memory device is one or more physical apparatuses used to store data or programs on a temporary or permanent basis. The device can include volatile memory and requires power to maintain stored information. The device can additionally or alternatively include non-volatile memory and retains stored information when the digital processing device is not powered. The non-volatile memory can be flash memory, dynamic random-access memory (DRAM), ferroelectric random access memory (FRAM), and phase-change random access memory (PRAM). The device can additionally or alternatively include a display to send visual information to a user. The display can be a cathode ray tube (CRT), a liquid crystal display (LCD), a thin film transistor liquid crystal display (TFT-LCD), an organic light emitting diode (OLED) display, a plasma display, a video projector, a combination thereof, or be any other suitable display. The OLED display can be a passive-matrix OLED (PMOLED) or active-matrix OLED (AMOLED) display. The device can additionally or alternatively include an input device to receive information from a user. The input device can be a keyboard, a pointing device (e.g., a mouse, trackball, track pad, joystick, game controller, stylus, etc.), a touch screen or a multi-touch screen, a microphone to capture voice or other sound input, a video camera or other sensor to capture motion or visual input, a combination thereof, or include any other suitable input device.

The source of the content is preferably one or more online social networking systems. Alternatively, the content source can include non-social streams (e.g., weather sources, seismic records, etc.), news sources, blogs, or any other suitable content source. The method is preferably capable of accessing and aggregating content from one or more social networking systems. Each social networking service is preferably an online service, platform, or site that preferably includes a plurality of user accounts, wherein each user account is preferably associated with a unique user. Examples of social networking systems include Facebook, Twitter, Linkedin, a digital group formed from linked email addresses, or any other suitable digital networking system. The social networking system preferably stores the generated content, but can alternatively facilitate persistent or temporary content storage on an external storage system. The content generated by the user account is preferably arranged on a user page or content feed (i.e., content stream) of the user account on the respective social networking system. The content feed can include user-generated content (e.g., content posted by the user account to the social networking service). The content feed for a user account can additionally or alternatively include content posted by secondary user accounts to the social networking system. The secondary user accounts can be user accounts that are followed, friended, or otherwise directly connected to the user account. The content feed is preferably a time-ordered list (e.g., ordered according to the time of generation), more preferably inversely time-ordered with the most recent content at the top of the list, but can alternatively be ordered according to popularity (e.g., as determined from the number of views of the content, number of actions on the content, etc.), or ordered according to any other suitable parameter.

Each unique user can be associated with a user account on one or more social networking services. The method can aggregate the content associated with the multiple user accounts that are associated with a user. The user preferably indicates the user account associated with the user (e.g., usernames) for each of the social networking services to which the user belongs on the aggregation system, such as by entering and/or signing into each social networking service through the aggregation system (e.g., native application or browser application) that performs the method. However, user accounts that are associated with the user across multiple social networking services can be otherwise determined.

A location can be a set of geographic coordinates (e.g., latitude and longitude), a place name (e.g., county, city, landmark, intersection, etc.), a physical street address, distance from a given location, presence within a specified radius from a given location, a graphical depiction on a map, a polygon, a geofence, or any other suitable location expression. Geolocation can involve geocoding to find associated latitude and longitude from other geographic data. Geolocation can additionally or alternatively involve reverse geocoding to back code latitude and longitude coordinates to a readable address or place name. Geolocation can additionally or alternatively include determining the location based on the content of a post (e.g., from text, images, sounds, etc. within the post). The location can be determined based on GPS coordinates provided by a device, triangulation between mobile phone towers and public masts (e.g., assistive GPS), Wi-Fi connection location, WHOIS performed on IP address or MAC address, GSM/CDMA cell IDs, location information self-reported by a user, or determined in any other suitable manner.

A geofence can be a virtual representation of a geographic region, wherein the geographic region can encompass one or more geographic locations. Alternatively, the method can be performed with a set of spacefences, which can define a three-dimensionally limited space to be monitored. Each geofence preferably includes an imaginary boundary enclosing a geographic region, wherein the boundary includes a set of imaginary segments forming a closed loop encircling the geographic region. However, the boundary can alternatively include a circle or other shape defined relative to a geographic location (e.g., a center point), or be defined in any other suitable manner. The segments are preferably linear segments, but can alternatively be curved or otherwise defined. The boundary can form a geometric shape (e.g., a polygonal shape) and is preferably non-circular, but can alternatively define a circle or any other suitable shape.

The geographic region enclosed by the geofence preferably encompasses one or more geographic locations, but can alternatively cover any other suitable geographic area. Examples of geographic regions include solar systems, a surface of an entire planet, a planet volume, continents, countries, states, counties, cities, communities, buildings, and rooms. The geographic region preferably encompasses one or more geographic locations (e.g., geographic locations, event locations, physical locations, etc.), wherein a geographic location can be identified by a venue name, a user-defined name (e.g., "home"), a set of GPS coordinates, a set of latitude and longitude coordinates, a set of wireless cell tower triangulation information, an address, or any other suitable identifier for a geographic location.

The shape and size of the geofences are preferably predetermined, but can be dynamically determined. The geofences can be predetermined, automatically determined (e.g., based on feature values, content parameters, etc.), determined by a user, determined by a plurality of users (e.g., wherein the boundary is set or stored within the system after a threshold number of users select the boundary, within a predetermined accuracy threshold), randomly determined, determined based on physical barriers (e.g., run along a wall, etc.), determined based on political delineations (e.g., along a city border, country border, etc.), determined based on third party reference points (e.g., cell tower coverage areas, etc.), be predetermined geographic increments (e.g., 150 m by 150 m squares), or determined in any other suitable manner. The geofences can be entered by an administrator (e.g., a user with administrator permissions), determined when a threshold number of users have entered the same geofence (within a given degree of variability) within a threshold period of time, determined based on historical content generation densities over space (e.g., wherein the geofence is defined by the locations at which the content density falls below a threshold value), or defined in any other suitable manner.

Each geofence preferably includes a single boundary, such that a geofence encloses a continuous geographic region within the respective boundary. However, the geofence can include multiple boundaries, wherein the boundaries are preferably nested (e.g., such that the geofence encloses an annular region or a region is excluded from the geofenced region). Boundaries independently enclosing separate or overlapping geographic regions are preferably considered separate geofences, but can alternatively be considered part of the same geofence.

Each geofence can be associated with an identifier. The identifier can be a geographic location within the geofence, a name of a venue within the geofence (e.g., wherein the venue name can be globally or locally unique or non-unique), the name of a political subdivision wholly or partially within the geofence (e.g., a neighborhood name, city name, etc.), the name of an event associated with the geofence, or be any other suitable identifier.

Each geofence can additionally be associated with a normalization factor, which functions to normalize the feature values that are determined for each geofence. The normalization factor can be a scalar value, a vector, a pattern, or any other suitable normalization factor. The normalization value can be a baseline value, average value, or any other suitable value for a feature or set thereof. The normalization pattern can be described by a matrix, point in a hyper-dimensional space, density surface, or any other suitable means. In one example, a geofence in Times Square, New York can be associated with a higher volume of content, and therefore have a different normalization pattern than a geofence in upstate New York. The normalization factor is preferably determined based on historic content generation in the geographic location (e.g., based on historic content data), but can alternatively be determined in any other suitable manner.

A plurality of geofences is preferably determined (e.g., predetermined or dynamically determined), but a single geofence can alternatively be determined. The geofences of the plurality can be overlapping, entirely separate, contiguous, or otherwise arranged. The overlapping geofences can be nested (inclusive), wherein a first geofence entirely encloses the geographic region enclosed by a second geofence. The nested geofences can be concentric, offset, or otherwise arranged. The plurality of geofences can include multiple sets of nested geofences, wherein each set can include multiple tiers of geofences. The geofences within each tier can be overlapping, entirely separate, contiguous, or otherwise related. In one example, the plurality of geofences can include a geofence for a state, a geofence for a city within the state, a geofence for a neighborhood within the city, and a geofence for a venue within the neighborhood, wherein content for all of the previously mentioned geofences can be simultaneously monitored. Alternatively, the overlapping geofences can encompass a shared geographic location or overlap in any other suitable manner. However, the geofences can be organized or defined in any other suitable manner.

In a first variation of the method, the geofences have substantially the same shape, are contiguous with adjacent geofences (e.g., share a border), are non-overlapping, and cooperatively cover a substantially contiguous geographic region. In a specific variation, the geofences cooperatively form a grid or other matrix overlaid over the geographic region. In a specific example, each geofence is 150 m×150 m, but can alternatively be larger or smaller. In a second variation of the method, the system includes overlapping geofence tiers, wherein each geofence of a higher-level tier encompasses one or more geofences of a lower-level tier. In a third variation of the method, the shape, size, or any other suitable boundary parameter is determined based on the content frequency, density, or other content parameter. In a fourth variation of the method, the geofences can be determined based on region identifiers, but can be otherwise determined.

An event is preferably an intersection of a physical region and a set of feature values. The event can additionally be associated with a timeframe. The event can be predetermined (e.g., a planned event, such as an awards ceremony), recurring, spontaneous (e.g., a car crash), public, private (e.g., "work," "at home," etc.), or any other suitable event. The event is preferably a spontaneous event that is dynamically determined, but can alternatively be a pre-defined or user-defined event. A pre-defined or user-defined event is preferably an event wherein a combination of event parameters defining the event is explicitly received from or defined by a user, and can be a calendar event, a recurring event, or any other event defined in any other suitable manner. A spontaneous event is preferably dynamically determined from the parameters of non-calendar content (e.g., non-calendar events), wherein the combination of event parameters defining the event (e.g., event location or region, timeframe, attendees, etc.) is not pre-determined or received from a user (user-defined). The spontaneous event is preferably determined based on a content parameter value, wherein the event can be determined when the content parameter value exceeds a threshold value. An event is preferably determined in response to the probability of the event exceeding a threshold probability, but can alternatively be determined in response to any other suitable event. More preferably, the method functions to calculate the probability that an event is currently occurring within a geofence, wherein the geofences and/or event regions and associated event labels can be ordered based on the respective probability.

Figure 9:
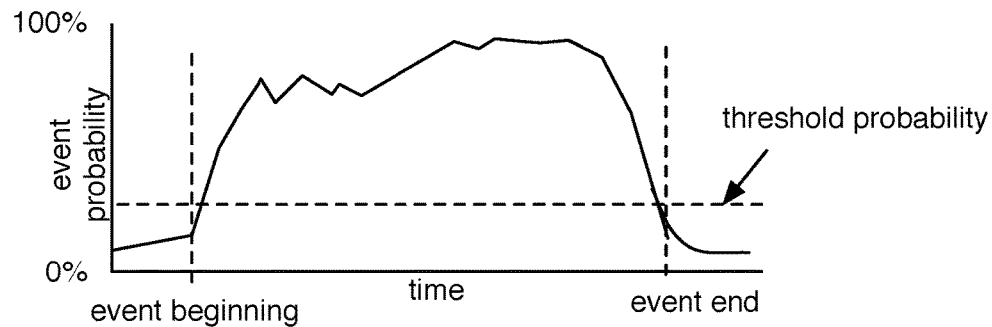
FIG. 9 is a schematic representation of determining the event beginning and ending timestamp based on event probability.

The event can additionally be associated with an event timeframe, which functions to delineate the start and stop times of the event. In one variation, the event timeframe can be used to determine when an event has begun, or when the event starts becoming relevant to a population of users (e.g., and therefore promoted to users). The event timeframe can also be used to determine when an event has ended, or when the event has ceased being relevant to a population of users (e.g., and therefore not promoted to users). However, the event timeframe can be used in any other suitable manner. The event timeframes can be predetermined or dynamically determined, such as based on the event probability. In one variation, the event start time can be determined based on the time at which an event probability for the geofence rises above a threshold probability, and the event end time can be determined based on the time at which the event probability for the geofence falls below a second threshold probability, as shown in FIG. 9. Alternatively, the event start time can be determined based on the time at which an event probability for the geofence increases beyond a threshold rate, and the event end time can be determined based on the time at which the event probability for the geofence decreases beyond a threshold rate. However, the event timeframe can be otherwise determined.

The set of feature values function to characterize the parameters of the content associated with (e.g., geotagged with) a location within the geofence (geofence content). The set of features for which values are determined can be volumetric characteristics, time-dependent characteristics, subject matter characteristics, text characteristics, image characteristics, sound characteristics, video characteristics, or any other suitable characteristic. Examples of features include content volume within the geofence, content generation density, content generation frequency, patterns of content generation over a period of time, count of specific subject matter topic mentions, frequency of monitored subject matter mentions, changes in the count of monitored subject matter mentions, counts of monitored words, changes in counts of monitored words, changes in word ratios (e.g., vocabulary size changes), number of monitored sounds, frequency of monitored sound occurrence, changes in counts of monitored sound occurrence, number of monitored object images, frequency of monitored object occurrence, changes in counts of monitored object images, authoring persona densities, persona ratios, or any other suitable feature descriptive of an event-indicating aspect of the content. The feature values can additionally include the results of the event detection and/or features of the event detection results, such as the event probability, event probability patterns over a predetermined time period, category probabilities, category probability patterns over a predetermined time period, or include any other suitable feature value. The combination of features forming the considered set of features can be specifically determined for each geofence, be determined for a set of geofences, or be determined for any suitable number of geofences.

The set of features can be learned, selected (e.g., manually or automatically), computed, or otherwise determined. The set of features can be dynamic or substantially static. Each feature type can be a categorization, such as a broad topic or theme (e.g., conflict, violence, fire). The feature types can additionally include subdivisions of categorizations: classifications (e.g., fire, smoke, ball, 49ers), or any suitable number of subclasses. These feature types can subsequently be used to characterize the event. For example, a geofence associated with an 80% probability that a sports event is occurring within the encompassed geographic region, a 60% probability that a basketball event is occurring, and a 20% probability that a football event is occurring can be tagged with sports, basketball, and football.

The feature values function to represent how closely the content in a geofence is associated with a given feature. The feature values can be percentages (e.g., content composition, such as the content associated with the geofence is 30% sports), numbers (e.g., rated a 5 out of 10 for recreation, 5 pieces of content associated with recreation, etc.), probabilities (e.g., the content is 50% likely to be about sports), or any other suitable representation of the relationship between the geofence content and the feature. The feature values are preferably determined for each geofence, but can alternatively be determined for a set of geofences.

In a first example of dynamic event detection based on feature values, the probability that an event is currently occurring in a geofence can be increased in response to detection that the number of people generating content about a specific category or classification (e.g., a specific topic) disproportionately increases relative to the change in other categories or classifications. In a second example of dynamic event detection based on feature values, the probability that an event is currently occurring in a geofence can be increased in response to the overall ratio of images of a specific object increasing. In a second example of dynamic event detection based on feature values, the probability that an event is currently occurring in a geofence can be increased in response to the density of a given type of persona increasing within the geofence beyond a predetermined threshold, or in response to the ratio of a given type of persona relative to the whole increasing beyond a threshold ratio.

Receiving content associated with a geofence S100 functions to identify content associated with a geofence, wherein the feature values are calculated based on the content. Receiving content associated with a geofence S100 preferably includes receiving a set of content associated with the geofence, wherein the feature values are calculated based on the plurality of content. However, a single piece of content or any other suitable volume of content can be received, and the feature values can be calculated based on the feature values of individual pieces of content (e.g., instead of the plurality as a whole) or calculated based on any other suitable content population.

The content is preferably content received from a set of social networking systems, but can alternatively be any other suitable content. The content can be retrieved from the social networking system, received in response to the occurrence of a trigger event (e.g., content posting to the social networking system), received in response to a request or query (e.g., wherein the response or query identifies a user account, a geographic region, a geographic location, or any other suitable search term), or otherwise obtained. The content is preferably generated by a user at a user device, and can be posted to or otherwise associated with the user account on the social networking system. The content can be received at a predetermined frequency (e.g., 1 millisecond), in response to the occurrence of an analysis event (e.g., in response to receipt of a user request), or at any other suitable frequency.

The content is preferably associated with the geofence in which the associated content location is located, but can be otherwise associated with the geofence. The content can be associated with a geographic location (e.g., geotagged) by the social networking system, associated with a geographic location by the event detection system (e.g., as disclosed in Ser. No. 13/678,404 filed 15 Nov. 2012, incorporated herein in its entirety by this reference), or associated with a geographic location in any other suitable manner. Each geofence is preferably concurrently monitored, but can alternatively be sequentially monitored or monitored at any other suitable frequency. In one variation of the method, the entire habitable surface of a planet can be concurrently monitored for content. In a second variation of the method, the landmasses of a planet can be concurrently monitored for content. However, any suitable geographic location can be concurrently monitored for content.

In a first variation of the method, receiving content associated with the geofence S100 includes monitoring content for a set of geofences. More preferably, the method includes monitoring a set of social networking systems for content associated with one or more of the set of geofences. Monitoring content for a set of geofences can include sending queries to the set of social networking systems for content associated with locations or geographic regions encompassed by each geofence, wherein the content returned in response to the query is associated with the respective geofence. The queries can be sent at a predetermined frequency, or the social networking system can store a standing content query for the event detection system. Multiple geofences can be concurrently monitored, sequentially monitored, or monitored in any other suitable manner.

In a second variation of the method, receiving content associated with the geofence S100 includes receiving content from the social networking system (e.g., the content is automatically pushed to the event detection system) and associating the content with a geofence based on the respective content geographic location after content receipt. This variation can additionally include determining (e.g., assigning) a geographic location for the content prior to geofence association. The event detection system can receive all content, and discard the content that falls outside of the geographic region.

In a third variation of the method, the event detection system retrieves new content from the set of social networking systems at a predetermined frequency (e.g., once every second). The content can be sorted into the geographic regions according to their associated geographic locations. Content falling within a geographic region can be cached in short-term storage. Content that is not included in any geographic regions can be discarded or otherwise stored. However, content can be otherwise received and associated with the geofence.

The content is preferably associated with the geofence through a content identifier, wherein the content identifier can be stored in association with the geofence by the event detection system (e.g., wherein the event detection system discards or does not store the media of the content). Alternatively, the content itself (e.g., including the media and any associated metadata) can be stored in association with the geofence by the event detection system. However, the content can be otherwise associated with the geofence.

Figure 2:
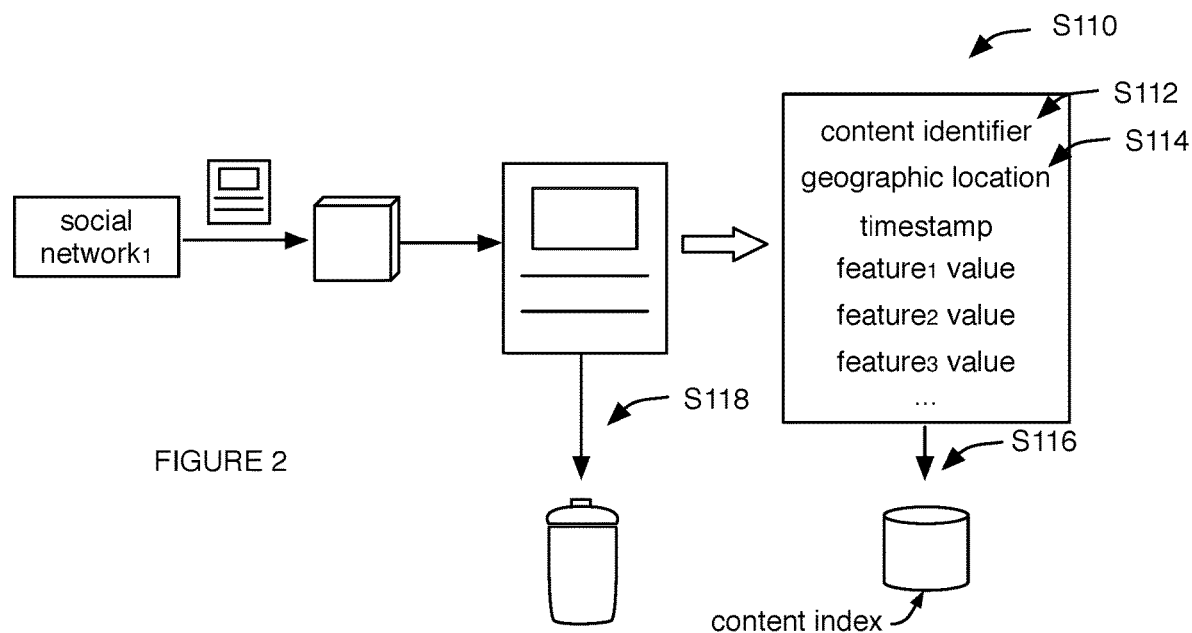
FIG. 2 is a schematic representation of indexing content.
Figure 3:
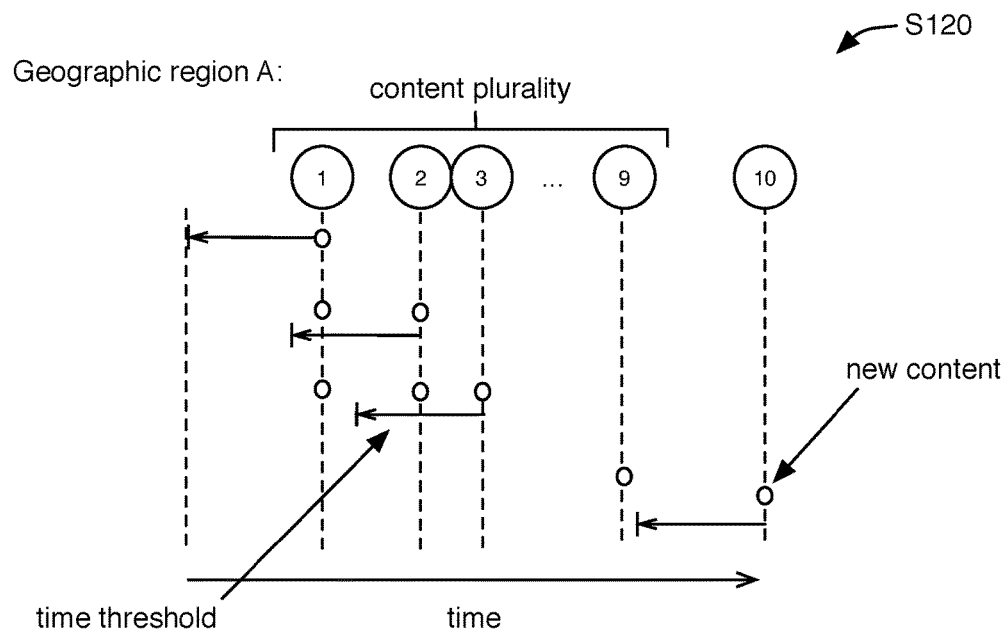
FIG. 3 is a schematic representation of determining a plurality of content associated with a geofence.

In the variation wherein a content identifier is stored by the event detection system, receiving content can additionally include indexing the content Silo, as shown in FIG. 2. The content is preferably indexed by the event detection system, but can alternatively be indexed by the social networking system or by any other suitable computing system. The content can be indexed in response to content receipt, indexed at a predetermined frequency (e.g., wherein multiple pieces of content are concurrently indexed), indexed in response to event detection, or indexed at any other suitable time.

Indexing the content S110 can include determining a content identifier for the piece of content S112, which functions to identify the content within the event detection system. Determining a content identifier can additionally function to determine a retrieval identifier, such that the event detection system can retrieve or attempt to retrieve the content from the source social networking system based on the content identifier. The content identifier can be unique to the event detection system, unique to the social networking system from which the content was received, globally unique, generic across social networking systems, or otherwise identified. The content identifier can be determined based on the content receipt time, content generation time (post time), source social networking system, associated geofence, authoring user account, substance, or based on any other suitable content parameter.

Indexing the content Silo can additionally or alternatively include determining content parameters for the content S114. The content parameters can include a geographic identifier, timestamp, feature values (e.g., the same or different features as that determined for the plurality of content), metadata, substantive parameters, or be any other suitable content parameter. When the content lacks a geographic identifier or timestamp, the method preferably determines a geographic identifier and/or timestamp for the post, using the method disclosed in U.S. application Ser. No. 14/043,479 filed 1 Oct. 2013, incorporated herein in its entirety by this reference, or using any other suitable method. Metadata can include the content source (e.g., the front camera of a device, back camera of a device, keyboard, touchscreen, etc.), the geographic identifier (e.g., a geotag), timestamp, authoring user account, or any other suitable available metadata. Substantive parameters can include content type (e.g., image, text, video, audio, etc.), the subject (e.g., nouns, main focus of images, etc.), as determined by keyword analysis, natural language processing, image processing, audio processing, or any other suitable processing method, content variables (e.g., number of characters used, number of a specific character used, color intensity, color saturation, color prevalence, audio volume, audio patterns, keyword count, keywords, etc.), or any other measureable substantive parameter of the content. The content parameters are preferably determined by the event detection system, but can alternatively be extracted by the social networking system or by any other suitable computing system.

Indexing the content can additionally or alternatively include storing the content identifier and associated content parameters for the content S116 and discarding the content S118. The content identifier and associated content parameters can be stored in a content index by the event detection system or by any other suitable computing system. Alternatively, the content could never be downloaded to the system, wherein the content information (e.g., timestamp, location identifier, post parameter values, etc.) can be determined from the post as supported on the third-party social networking system. However, the content can be otherwise indexed. In response to receipt of a query including a location or a time, the content index is preferably searched, the content identifier associated with geographic identifiers satisfying the query location or timestamps satisfying the query time identified, and the content retrieved or requested from the social networking system from which the content was originally received. In one variation of the method, identifying content associated with a geofence can include querying the content index for content associated with geographic locations within the geofence, receiving content identifiers and associated content parameters from the content index, and performing the event detection analysis on the returned information. The content index query can additionally include a timeframe, other time limit, or any other suitable query value. However, the content index can be otherwise used.

Receiving content associated with a geofence S100 can additionally include determining a set of content for event detection analysis S120, which functions to reduce the amount of content processed during the analysis. The set of content is preferably a plurality of content, but can alternatively be a single piece of content or include any other suitable number of content. The set of content can be limited temporally (e.g., based on temporal proximity), by subject matter (e.g., wherein all the content associated with the geofence is filtered for event-related content, such that the feature values are determined based on event-related content only), or restricted by any other suitable parameter.

In a first variation, determining the plurality of content for analysis S120 includes identifying content, associated with the geofence, which was generated within an inclusion time threshold of a reference time. The reference time can be an instantaneous time, the posting or generation time of a piece of content associated with the geofence (e.g., the last piece of content that was generated), the receipt time of a piece of content (e.g., the last piece of content that was received), or be any other suitable reference time. The inclusion time threshold can be predetermined or dynamically determined. The inclusion time threshold can be constant or change as a function of time, feature value (e.g., frequency, density, etc.), event probability, or change in any other suitable manner. In a second variation, any content associated with the geofence within an inclusion time threshold from the instantaneous time can be included within the plurality. In a third variation, any content associated with the geofence is included in the plurality as long as an event is detected. In a fourth variation, only new content (e.g., content received since the last content plurality determination or event analysis) is included in the plurality. In a fifth variation, only content related to the event is included in the plurality. However, the plurality of content can be otherwise determined for analysis. Content pluralities for different geofences are preferably determined in the same manner, but can alternatively be determined using different methods.

In a specific variation of the first variation, a first piece of content is included in the plurality of content when the first piece of content is associated with a timestamp that was within the inclusion time threshold of a piece of content of the plurality, such that the content within the plurality are associated by temporal proximity. In a specific example, a first piece of content, generated at a first timestamp, can be part of the plurality. A second piece of content, generated at a second timestamp, can be included in the plurality when the second timestamp is within the inclusion time threshold of the first timestamp (e.g., before or after). Alternatively, the second piece of content can be excluded from the plurality when the second timestamp is outside of the inclusion time threshold of the first timestamp.

In a second specific variation of the first variation, determining the plurality of content for analysis includes, in response to receipt of the new content, identifying a set of content associated with the geofence, wherein the latest piece of content within the set was generated within the inclusion time threshold from the new content, such that each piece of content within the set was generated within the inclusion time threshold from the next piece of content. If the set is empty, the new piece of content is added to the empty set. The content within the set are discarded if no new pieces of content are added to the set within the predetermined period of time. The content is retained within the set if new pieces of content are added to the set within the predetermined period of time. The inclusion time threshold can remain constant, vary as a function of the number of content (e.g., increase or decrease with increased content in the set), vary as a function of frequency (e.g., increase or decrease with increased content generation frequency), or vary in any other suitable manner. However, the plurality of content can be determined in any other suitable manner.

Determining a set of feature values for each of the set of geofences S200 functions to reduce the content associated with each geofence into a set of metrics that can be used to analyze the social activity in the geofence. The feature values can be determined based on the plurality of content (e.g., content associated by inter-set temporal proximity, etc.), determined based on individual feature values for each piece of content from the plurality of content, determined based on the new content received since the last time the feature values were determined for the geofence, determined based on content generated, received, or otherwise associated with a time within a predetermined time period of the value determination time, determined based on content associated with a single or set of times, determined based on all content associated with the geofence, or determined based on any other suitable content.

Figure 4:
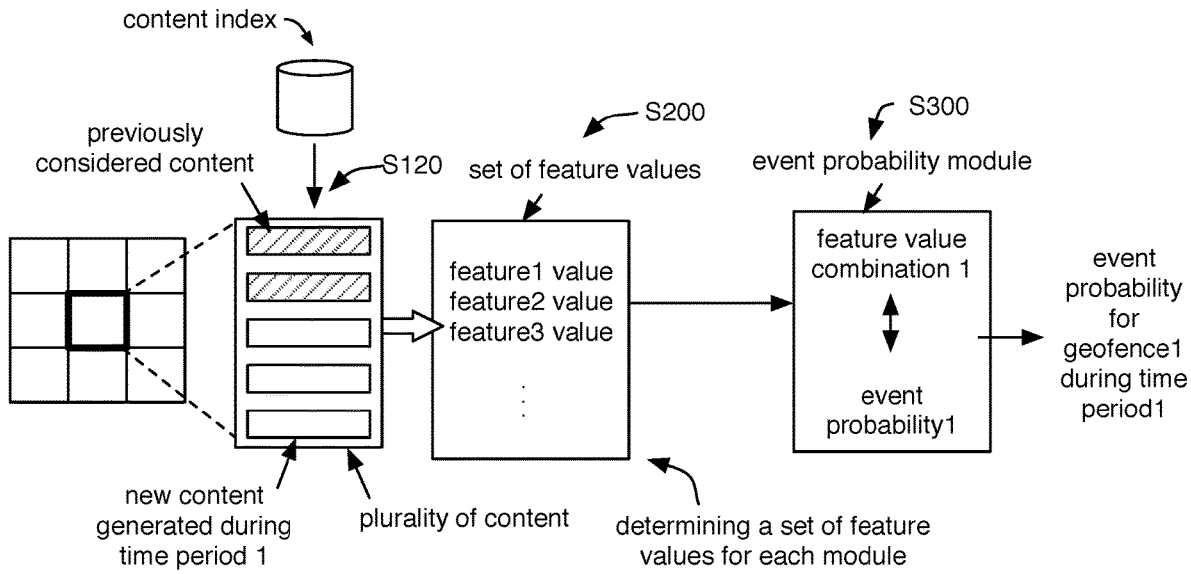
FIG. 4 is a schematic representation of a variation of dynamic event detection based on feature values for the plurality of content.
Figure 5:
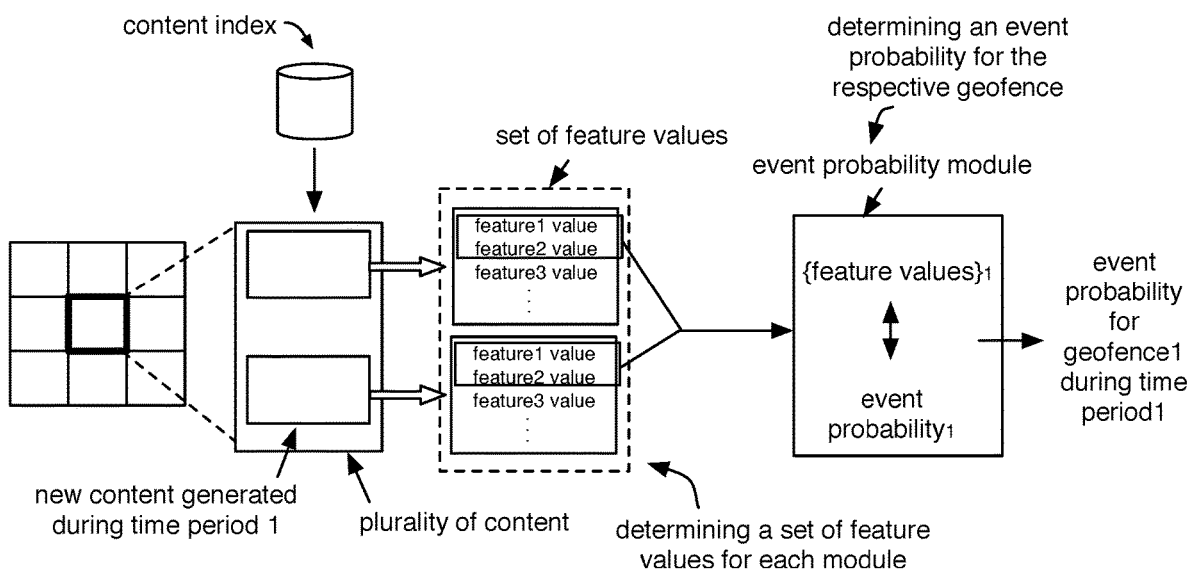
FIG. 5 is a schematic representation of a variation of dynamic event detection based on feature values for each of the plurality of content.
Figure 6:
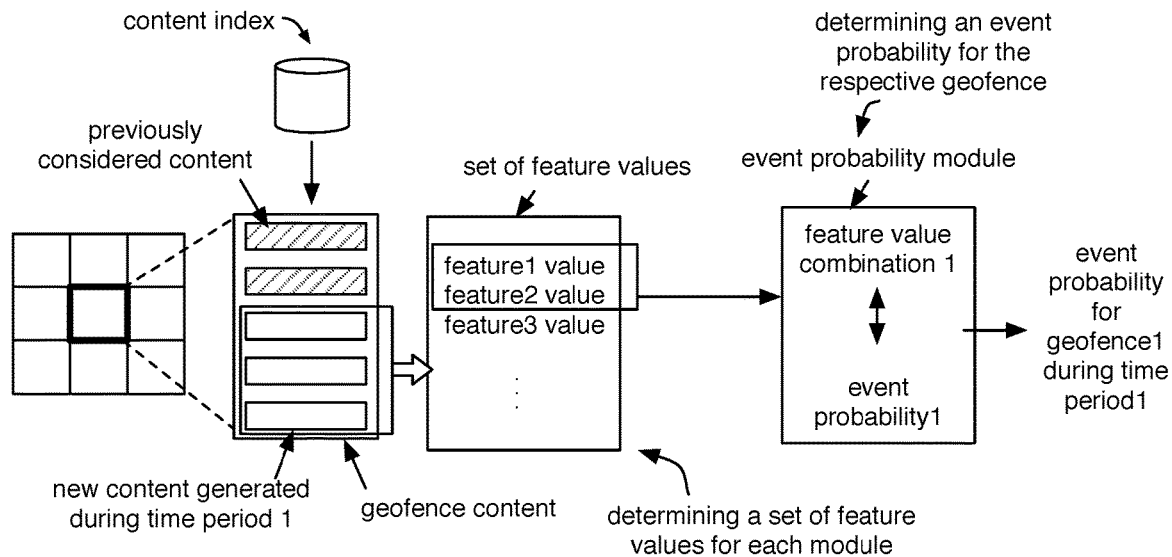
FIG. 6 is a schematic representation of a variation of dynamic event detection based on feature values for the plurality of content, wherein the plurality of content includes new content.

The feature values are preferably determined based on the plurality of content as a whole or as a population, as shown in FIG. 4, but can alternatively be determined on a per-content or individual content basis, as shown in FIG. 5. For example, a keyword ratio can be determined based on the occurrence of a set of keywords within the entire population of the content plurality (e.g., feature determination based on the content plurality as a whole), or be determined from the individual ratios for the set of keywords within each piece of content of the plurality (e.g., feature determination based on individual pieces of content within the plurality).

Determining a set of feature values for each geofence S200 can include determining the feature values for each of a plurality of features. Alternatively, determining the set of feature values can include determining a reduced set of features from the plurality of features, then determining the feature values for each of the features in the reduced set. However, any other suitable set of feature values can be determined. The feature values can be determined at a predetermined frequency, in response to receipt of new content associated with the geofence, in response to event detection or determination of an on-going event within the geofence, or in response to receipt of a query (e.g., an event query or geofence query), or determined at any other suitable time. The feature values can be calculated, determined based on a graph, selected from a chart, empirically determined, output from any module, determined using a set of machine learning algorithms, or otherwise determined.

Determining the feature values S200 can include determining the popularity of the event S220, which can be used to detect an event, categorize the event, or used to post-process the event information in any other suitable manner. The event popularity can additionally function as a filter for certain applications (uses) of the event detection. The event popularity can be determined based on the local popularity of the event, the global popularity of the event, and/or the spread of the event, as shown in FIG. 15. However, the event popularity can be determined based on change parameters of any of the aforementioned features (e.g., the rate of change or the acceleration of change), combination of the three, or be determined based on any combination of any other suitable feature. The event popularity can be determined based on the plurality of content associated with the geofence, any content associated with the geofence, content unassociated with the geofence, such as content associated with a secondary geofence different from the first or content unassociated with any geofences or geographic locations, content associated with the event (e.g., content associated with the event based on keywords, references to users known to be associated with the event, sentiment, tags, or any other suitable reference to the event), or based on any other suitable content. The content unassociated with the geofence (outside content) can be determined to be about the event when the outside content shares attributes with the event content (e.g., timeframe, subject matter, combination of keywords, combination of topics, shared media, direct references, etc.), or be determined in any other suitable manner. The event popularity, local popularity, global popularity, and/or spread can additionally be determined based on the feature values, event probabilities, and/or any other suitable parameter associated with secondary geofences. The event popularity, local popularity, global popularity, and/or spread can additionally be determined based on the geographic location of content viewers (e.g., users, user accounts, or user devices that view or otherwise access the content), as determined from social network APIs, content references, or determined in any other suitable manner.

The local popularity is preferably measured as the popularity of the event (e.g., popularity of the subject matter, topic, etc.) within the geofence and/or proximal geofences, but can be alternatively determined. In a specific example, the local popularity can be determined based on the density of content referencing a common subject or topic within the geofence within a predetermined period of time. In another example, the local popularity can be determined based on the frequency of content referencing a common subject or topic within the geofence. The event popularity preferably scales with local popularity, but can alternatively be weighted by local popularity, or otherwise influenced by local popularity.

The global popularity is preferably measured as the popularity of the event in geofences outside of the event geofence, but can be alternatively determined. The global popularity is preferably determined based on content generated or received within a threshold period of time from event detection in the primary geofence (e.g., before or after), but can alternatively be determined based on content generated or received concurrently with the primary geofence content underlying the event detection, or determined based on any other suitable set of content. In one variation, the global popularity can be the number of user accounts or users generating content about the event outside of the event geofence. In a second variation, the global popularity can be the volume of content generated about the event outside the geofence. In a third variation, determining global popularity can include determining secondary geofences associated with the event, wherein the secondary geofence is different from the first geofence. The secondary geofence is preferably associated with the event through content associated with the secondary geofence. In a first example, the secondary geofence can include one or more pieces of content associated with the event. In a second example, a secondary event can be detected within the secondary geofence, wherein the secondary event can be associated with the event detected within the primary geofence. The content or secondary event can be associated with the event by having a content or feature match parameter higher than a match threshold with the event, event-associated content, or content of the primary geofence. The content or secondary event can be associated with the event when the underlying content references one or more of the plurality of content associated with the primary geofence, references the event, references the geofence, or references any other suitable parameter related to the event. However, the secondary geofence can be associated with the event in any other suitable manner. The event popularity preferably scales with global popularity, but can alternatively be weighted by local popularity, or otherwise influenced by local popularity.

The spread is preferably determined as a function of the geographic distance between the event geofence and a secondary geofence associated with the event-related content, but can be alternatively determined. More preferably, the spread is determined (e.g., measured) as a function of the geographic distance between the event geofence and a set of secondary geofences associated with event-related content (e.g., all secondary geofences associated with event-related content), but can alternatively be determined based on any other suitable set of geofences. However, the spread can be otherwise determined. In one example, the spread can be determined based on the distances between the event geofence and the secondary geofences. In a second example, the spread can be determined based on the distance between the event geofence and the furthest secondary geofence. In a third example, the spread can be based on the distance between the event and the furthest secondary geofence satisfying a content parameter threshold (e.g., event-referencing content density or frequency of generation). In a fourth example, the spread can be based on the velocity and/or acceleration at which event-related content is propagating through secondary geofences. In a fifth example, the spread can be based on the distribution of secondary geofences, wherein a large spread can be determined in response to a wide distribution of secondary geofence locations, and a small spread can be determined in response to a narrow distribution of secondary geofence locations. However, the spread can be otherwise determined. The spread can be determined for the general population, a specific persona, or any other suitable set of users or geofences sharing a common attribute. The spread can be calculated based on the distances between the primary geofence and the secondary geofence, selected as the furthest distance between the primary geofence and a secondary geofence, or determined in any other suitable manner. The event popularity preferably scales with spread, but can alternatively be weighted by local popularity, or otherwise influenced by local popularity.

Determining the event popularity S220 can additionally or alternatively include predicting event popularity, which can function to determine whether an event will be popular (e.g., discussed globally) before the respective event popularity exceeds the popularity threshold. The event popularity can be predicted before the initiation of planned events, immediately following the occurrence or detection of an unplanned event, or predicted at any other suitable time relative to the event. Events predicted to be popular can be promoted within a list of possible on-going events. Predicting event popularity can include predicting the popularity based on the event probability, wherein a specific event probability or pattern of event probability over a time period within the geofence can be correlated with a popularity probability or popularity score. The correlation between event probability and event popularity is preferably learned (e.g., using machine learning techniques), but can be otherwise determined. Alternatively or additionally, predicting event popularity can include predicting the popularity based on the combination of labels or categories associated with the event. However, the event popularity can be otherwise predicted.

Determining the event popularity S220 can additionally or alternatively include determining the event nexus, which can be used to establish the primary geofence or set of geofences. The event nexus is preferably the geographic location or region in which the event occurred, but can alternatively be any other suitable geographic region. In one variation, the event nexus (primary geofence) is the geofence in which the event was first detected (e.g., in which the event was detected at the earliest timestamp). In a second variation, the event nexus can be determined based on the distribution of geofences in which the event is detected, wherein the geofences can be clustered about or in relation to the event nexus. In a third variation, the event nexus can be determined based on event-associated metadata (e.g., compass headings). For example, the direction of the camera can be extracted from event-associated images (e.g., based on the compass heading) and used to triangulate the event nexus. In a fourth variation, the event nexus can be the geofence having the highest event probability for the event. However, the event nexus can be otherwise determined.

Determining an event probability for the respective geofence based on the set of feature values S300 functions to determine whether an event was occurring at the time of geofence content generation. The event probability is preferably determined by an event determination module that receives a set of feature values and calculates the event probability based on the set of feature values. However, the event probability can be determined by any other suitable system. Determining the event probability can include selecting a reduced feature set (feature subset) from the full set of features (plurality of features) for the respective geofence and determining the event probability from the values of the features in the reduced feature set. However, the event probability can be determined based on the full set of features or otherwise determined. The event probability for the geofence can additionally or alternatively be determined based on the feature values, event probabilities, category probabilities, and/or any other suitable parameter of proximal or adjacent geofences, geofences within a shared timezone, or any other suitable geofence.

Selecting the reduced feature set (feature subset) functions to reduce the number of feature values processed by the event determination module to decrease computation time and/or increase resource utilization efficiency. The reduced set of features preferably includes less than the full set of features, but can alternatively be the entire plurality or be any other suitable set of features. The reduced set of features is preferably part of the plurality of features, but can alternatively be any other suitable set of features. In one example, the reduced feature set includes a set of elements, wherein each element is a superclass of a subset of the feature plurality (e.g., the reduced feature set includes a set of parent nodes of a hierarchy tree, wherein the feature plurality subsets are child nodes of the parent nodes). However, the reduced feature set can include any other suitable features. In one example, selecting the reduced feature set includes reducing a plurality of 30,000 features to a set of 4,000 features. The reduced feature set is preferably determined by applying machine learning techniques, but can alternatively be determined in any other suitable manner. Machine learning techniques that can be applied include supervised learning, clustering, dimensionality reduction, structured prediction, anomaly detection, and neural nets, but can alternatively include any other suitable technique. Examples of supervised learning techniques include decision trees, ensembles (bagging, boosting, random forest), k-NN, Linear regression, naive Bayes, neural networks, logistic regression, perceptron, support vector machine (SVM), and relevance vector machine (RVM). Examples of clustering include BIRCH, hierarchical, k-means, expectation-maximization (EM), DBSCAN, OPTICS, and mean-shift. Examples of dimensionality reduction include factor analysis, CCA, ICA, LDA, NMF, PCA, and t-SNE. An example of structured prediction includes graphical models (Bayes net, CRF, HMM). An example of anomaly detection includes k-NN Local outlier factor. Examples of neural nets include autoencoder, deep learning, multilayer perceptron, RNN, Restricted Boltzmann machine, SOM, and convolutional neural network. However, any other suitable machine learning technique can be used. The machine learning techniques and/or models used to select the reduced feature set can be substantially static or dynamically change over time.

Determining the event probability based on the feature values of the features in the reduced set functions to determine the probability of an event within the geofence based on the geofence content. The event probability can be the probability that an event is occurring within the geofence, the probability that an event of a given type is occurring within the geofence (e.g., a set of probabilities corresponding to a set of event types or categories), or be a probability of any other suitable event parameter. The event probability can be calculated from the feature values (e.g., from weighted feature values), selected from a chart or graph based on the feature values, selected based on the specific combination of feature values, output from any module (e.g., machine learning module), or otherwise determined. In one variation, the module (e.g., machine learning methods) used to determine the event probability can be static or dynamic (e.g., can change over time, based on content parameters, prediction accuracy or precision, etc., change in response to the occurrence of a trigger event, or change in any other suitable manner). In one variation of the method, a common event probability module used for all geofences within a set of geofences (e.g., the same model is used for all geofences). In a second variation of the method, each geofence is associated with a different event probability module. However, the event probability modules can be associated with geofences in any other suitable manner. The event probability modules of multiple geofences can dynamically vary independently, vary as a population of modules, or vary in any other suitable manner. The event probability modules can vary as a function of individual or global content parameters, prediction accuracy or precision, types of enclosed venues, or vary in any other suitable manner. In one example, a first event probability module (e.g., first set of machine learning models) is associated with a first geofence when the enclosed venue is categorized as a mall, and a second event probability module (e.g., a second set of machine learning models, different from the first) is associated with the first geofence when the mall is converted into a church. However, the event probability modules can be determined for a set or an individual geofence in any other suitable manner.

The event probabilities can additionally or alternatively include accounting for typical (e.g., baseline) content volume, subject matter, author personas, or other content parameters for the geofence S320. The typical content parameters are preferably baseline feature values, but can alternatively be any other suitable content parameter associated with the geofence. The typical content parameters are preferably patterns, but can alternatively be averages, minima, matrices, points in a hyper-dimensional space, density surfaces, or any other suitable value. The typical content parameters can be learned using machine learning techniques, calculated, received from a user, and/or otherwise determined. The typical content parameters are preferably used to normalize the determined feature values. Baseline feature values can be determined for all features or a subset of features.

Figure 10:
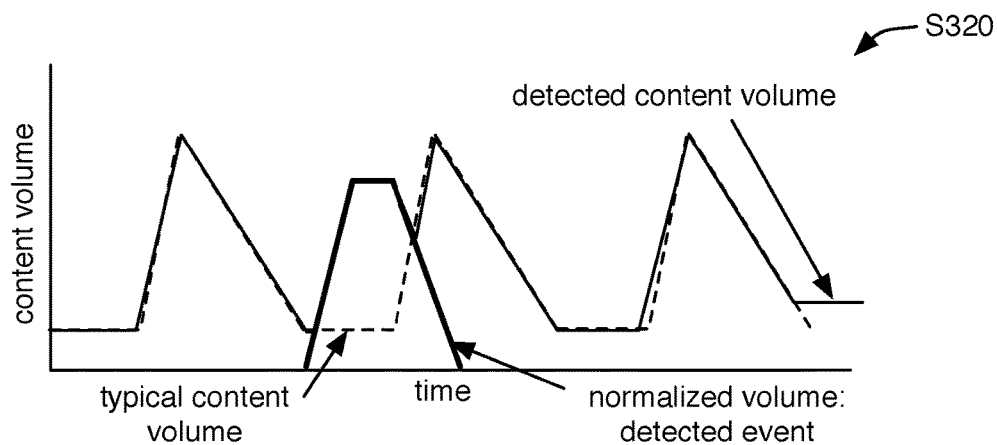
FIG. 10 is an example of normalizing content volume based on typical content volume for an airport and detecting an event based on the normalized content volume.
Figure 11:
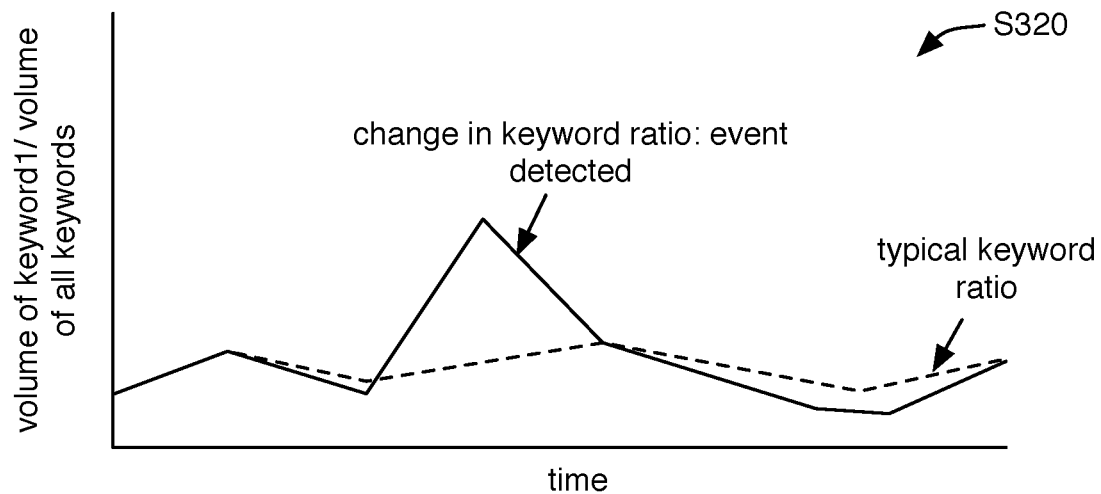
FIG. 11 is an example of normalizing keyword ratios based on typical keyword ratios and detecting an event based on the normalized keyword ratio.
Figure 12:
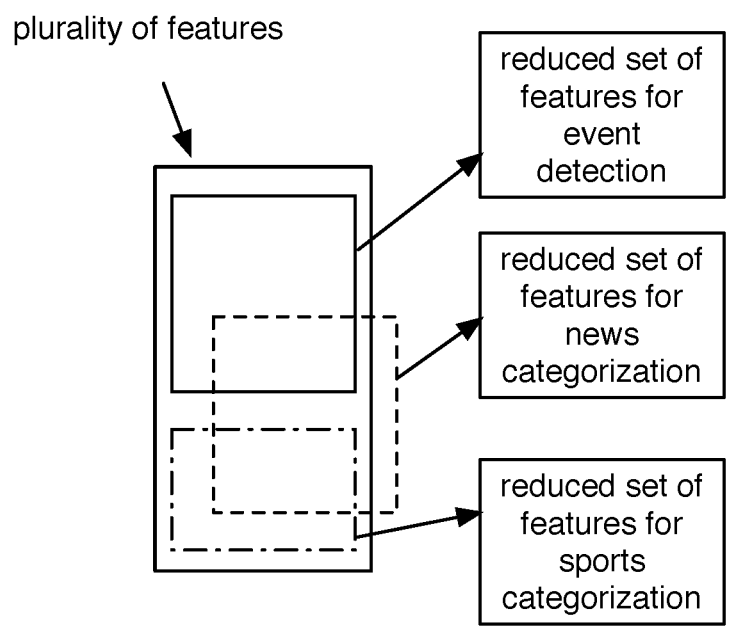
FIG. 12 is a schematic representation of an example of plurality of feature distribution among the module feature sets.

In a first example, the content volume in New York's Times Square is typically higher than the content volume on a freeway, wherein an event would not be determined for the Times Square geofence but would be detected for the freeway, given the same absolute volume change. In a second example, a predetermined set of keywords or topics can be associated with Times Square as typical keywords (e.g., "Times Square," "NYC") and a second set of keywords or topics can be associated with the freeway (e.g., "traffic," "cars"), wherein an event is not detected in response to an increase in the number of keywords in the geofence-associated set, but is detected in response to an increase in the number or ratio of keywords outside of the geofence-associated set. For example, an event can be detected in response to the keyword "cars" increasing in number or ratio in the Times Square geofence content, as shown in FIG. 11. In a third example, a typical pattern of content generation frequency or volume can be determined for an airport, as shown in FIG. 10. In a specific example, the volume of content typically increases after a plane has landed due to passengers posting content after the communication hiatus in the air. While this can be considered an event, this arrival event is typically not interesting or relevant to most users. Therefore, the pattern of content volume increase after airplane arrival can be learned, and subsequently determined feature values can be discounted based on the learned pattern to distinguish the pattern from a typical airport event and an airport event of interest. Alternatively or additionally, the pattern of content volume can be associated with a specific schedule (e.g., a learned airline landing schedule), or determined independent of a specific time, such that the pattern can be applied to the airport content based on an external airline schedule (e.g., wherein the scheduled or adjusted landing time can be determined and the pattern applied after schedule determination). However, the typical content parameters can be otherwise applied.

The method can additionally include detecting an event within the geofence in response to the event probability exceeding a threshold event probability S400, as shown in FIGS. 1 and 9. The threshold event probability can be the same for all geofences, different for each geofence, different for different sets of geofences, or vary in any other suitable manner. The different sets of geofences can be defined based on shared characteristics, such as content generation patterns, event probability patterns, enclosed venues (e.g., whether the geofence encloses a ballpark, stadium, or music venue), or based on any other suitable characteristic. The threshold event probability can be substantially constant over time, vary as a function of feature value or content parameters, or vary in any other suitable manner.

The method can additionally include determining the threshold event probability. The threshold event probability can be determined for the geofence, be determined for a set of geofences, or be determined for all the geofences. The threshold event probability can be received from a user, automatically determined (e.g., using a set of machine learning algorithms, such as MLAs wherein user-determined events are used as the groundtruth), dynamically determined, or otherwise determined. The threshold event probability can be determined based on historical event probabilities associated with the respective geofence, respective set of geofences, or a training set of geofences, determined based on historical feature values associated with the respective geofence, respective set of geofences, or a training set of geofences, or determined based on any other suitable information.

The method can additionally include determining a second event probability for the geofence, which can function to continually monitor the event probability within geofence. The second event probability is preferably determined for geofences with detected, on-going events, but can alternatively be determined for any other suitable geofence. The second event probability is preferably determined in response to the occurrence or detection of a trigger event, but can alternatively be determined at any other suitable time. The trigger event can be the receipt of new content associated with the geofence from a social networking system, the satisfaction of a time duration (e.g., wherein the probability is calculated at a predetermined frequency), in response to a request from a user, or be any other suitable trigger event. The second event probability is preferably determined in substantially the same manner as initial event probability determination, but can alternatively be determined in any other suitable manner. The second event probability can be determined based on the plurality of content associated with the geofence (e.g., the entire plurality, including old and newly received content), new content received since the prior event probability determination, or be determined based on any other suitable set of content. The second event probability can be determined using substantially the same reduced feature set and event probability threshold as initial event probability determination, but can alternatively be determined using a different reduced feature set and/or event probability threshold. Each event probability determination after the initial event probability determination can use the same feature set or a different feature set, and/or the same event probability threshold or different event probability threshold. However, the second event probability can be determined in any other suitable manner.

Figure 7:
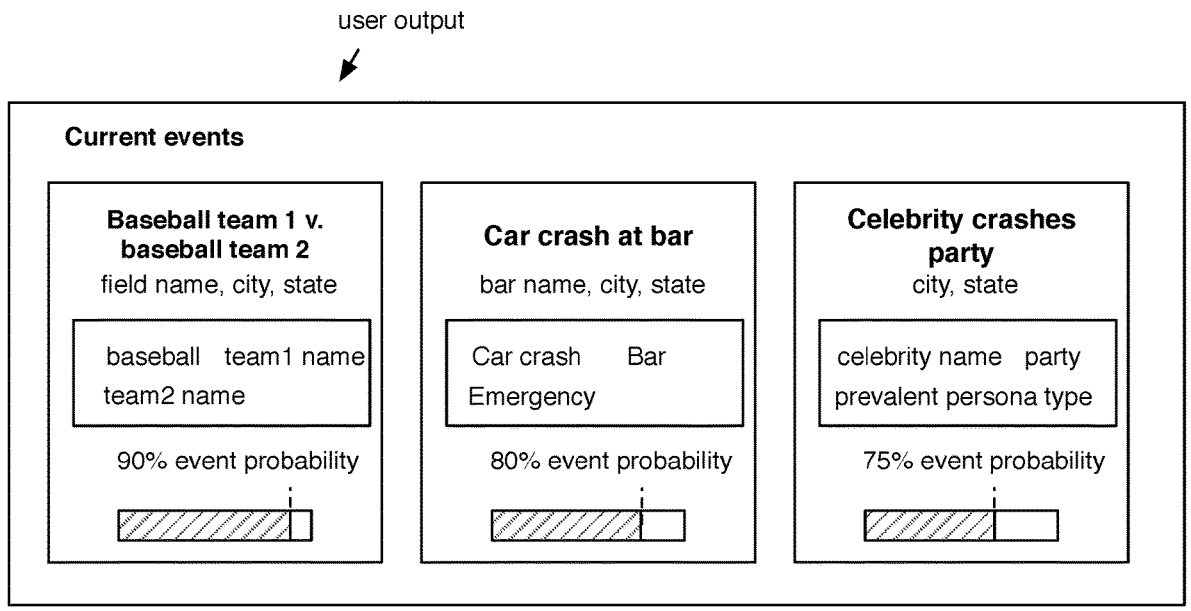
FIG. 7 is an example of an event listing ordered by event probability.

The method can additionally include characterizing the event S500, which functions to give a user an indication of the type of event occurring within the geofence, as shown in FIG. 7. Characterizing the event can include presenting, naming, or otherwise associating the event with one or more event identifiers. The event identifiers can be determined from the features having the highest probabilities, percentages, or other value for the content, but can alternatively be keywords, phrases, images, videos, sounds, or other media extracted from the content. In one example, the label can include a non-generic noun most frequently mentioned in the content. However, the label can be derived and associated with the event in any other suitable manner.

Figure 8:
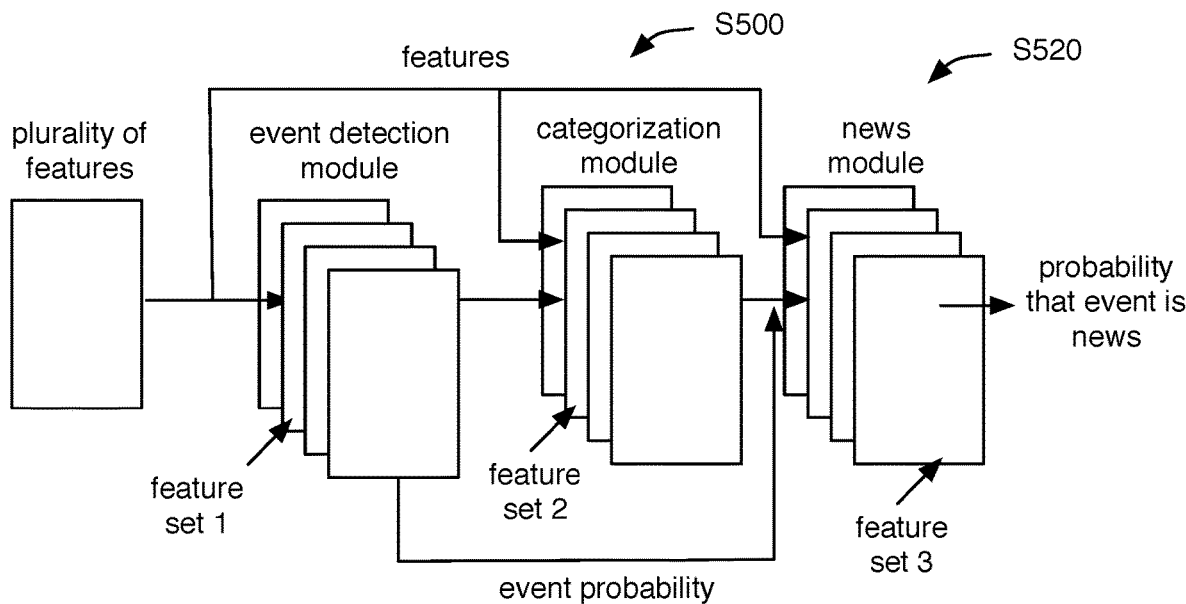
FIG. 8 is a schematic representation of a method including a first and second post-processing module.
Figure 13:
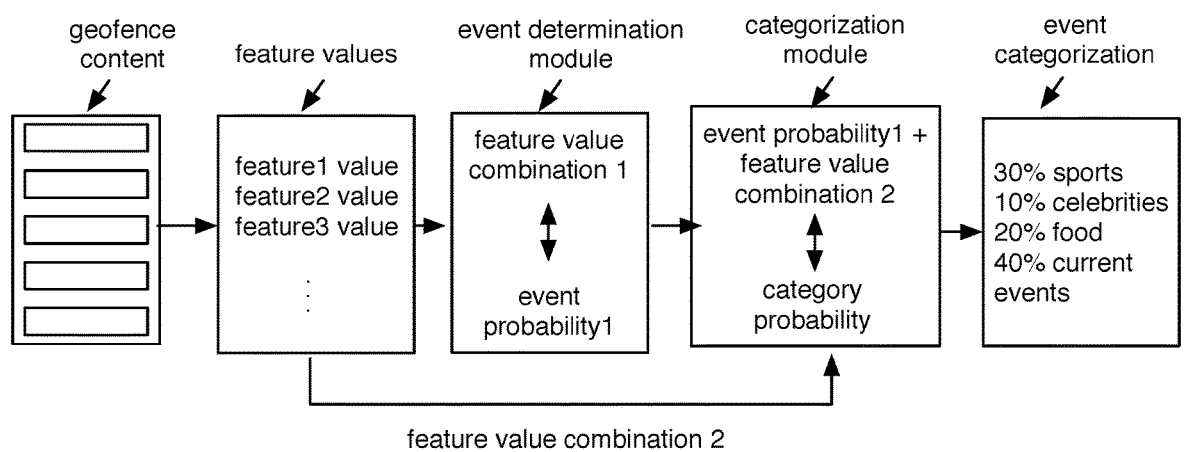
FIG. 13 is a schematic representation of an example of post-processing the values based on the event probability and a secondary set of feature values.
Figure 14:
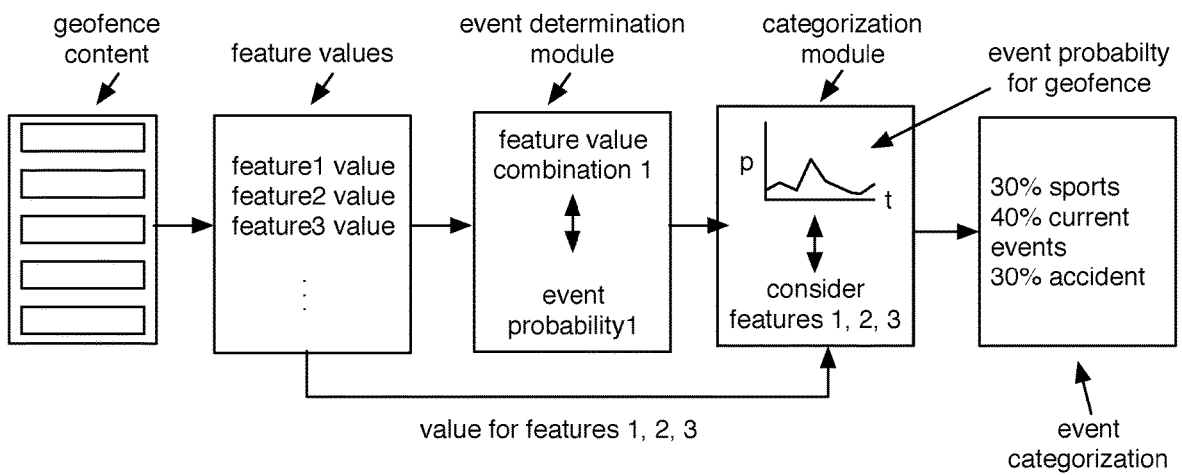
FIG. 14 is a schematic representation of an example of post-processing the values based on a time series of event probabilities and a secondary set of feature values.

The method can additionally include post-processing the feature values, as shown in FIG. 8, which functions to refine the labels associated with each event (e.g., refine event characterization, examples shown in FIGS. 13 and 14). Post-processing the feature values preferably does so by resolving redundancies (e.g., wherein a super-class and a sub-class are both included in the characterization), resolving conflicts (e.g., wherein two unrelated or conflicting labels are associated with the event when characterizing the event), replacing the labels with more descriptive labels, or refining the labels in any other suitable manner. A post-processing module preferably post-processes the feature values, any other suitable module can post-process the feature values. Post-processing the features can be desirable because not all features are considered in event determination (e.g., due to the computationally intense requirements needed to process the plurality of the features).

Post-processing the feature values preferably includes receiving the output of the event detection module, identifying secondary features for analysis based on the output, and refining the labels based on the values of the secondary features. However, the feature values can be otherwise post-processed.

The output of the event detection module preferably includes the probability that an event was occurring at the time the content was generated or posted, the labels associated with the event, and the percentages or probabilities for each label, but can additionally or alternatively include any other suitable information. The combination of the event probability, labels, and/or label probabilities preferably form a signature pattern that the post-processing module recognizes or associates with another known signature pattern, wherein the post-processing module can select a second set of features (secondary features) from the plurality of features based on the signature pattern. Alternatively, the post-processing module can determine which combinations of labels are likely or unlikely, and refine the labels toward likely label combinations.

The second set of features is preferably different from the first set of features used to determine the event probability, more preferably entirely different but alternatively including at least one feature different from the first set. The second set of features can be a subset of the plurality of features, the entirety of the plurality of features, or any other suitable set of features. The second set of features is preferably learned (e.g., applying machine learning techniques), but can alternatively be received from a user, empirically determined, or otherwise determined.

Post-processing the feature values can additionally include categorizing the event S520, which can function to identify whether the event will be relevant to a specific entity. In this variation, the post-processing module can select a second set of features that are targeted toward determining whether the event falls within a category (e.g., whether the event will be relevant to the entity). As above, the second set of features can be selected based on the event probability, labels, or any other suitable information. The post-processing module can additionally or alternatively select a subset of features from the second set for analysis, based on the output of a prior module (e.g., the event detection module, second post-processing module, etc.). Alternatively, the post-processing module can be specific to a category, wherein the second set of features are predetermined for the respective category and cooperatively determine whether the event falls within the respective category. The second set of features can be learned (e.g., through machine learning techniques), received from a user, or otherwise determined.

The second set of features is preferably associated with a single event category, wherein the features of the second set are cooperatively used to determine the probability of whether an event can be categorized as the respective event category. Alternatively, the second set of features can be associated with multiple event categories, wherein the features of the second set are cooperatively used to determine whether an event should be categorized as a first event category or as a second event category (e.g., wherein events having a first probability can be categorized as the first event category, and events having a second probability can be categorized as the second event category). However, the second set of features can be otherwise used.

For example, the post-processing module can select a first, second, and third feature for value analysis in response to determination of a first combination or pattern of event probability and label probability, and can select a fourth, fifth, and sixth feature for value analysis in response to a determination of a second combination or pattern of event probability and label probability. The post-processing module can additionally consider (e.g., extract feature values for) content that is not explicitly associated with the geographic location (non-geographic content), wherein the non-geographic content set can be associated with the event based on keywords, references to users known to be associated with the event, sentiment, tags, or any other suitable reference to the event. In one example, the post-processing module can determine whether the event would be of interest to a news facility, wherein the second set of features can include features that best identify news events (e.g., as opposed to recurring events, local events, scheduled events, etc.). For example, the second set of features can include features indicative of the popularity of the event or topic, virality features, spontaneity features, or any other suitable features.

The method can additionally include determining the second subset of features. The second subset of features can be determined for each of a plurality of event categories (e.g., wherein each event category is associated with a second subset of features), can be determined for a plurality of event categories (e.g., wherein multiple event categories are associated with a common second subset of features), or can be determined for any other suitable set of event categories. The second subset of features can be selected for the event category by a set of machine learning algorithms, by a user, or determined for the event category in any other suitable manner.

The category probability is preferably determined by a set of machine learning algorithms based on the second set of feature values (e.g., the same set of machine learning algorithms that determined the second set of features or a different set of machine learning algorithms), but can alternatively be calculated based on the feature values for the respective features of the second subset, be selected from a graph or chart, or be determined in any other suitable manner. In one variation, the category probability can be calculated from an equation (formula), wherein the equation can be determined by a set of machine learning algorithms. The set of machine learning algorithms determining the equation can be the same set of machine learning algorithms used to determine the second subset of features, but can alternatively be a different set of machine learning algorithms (second set of machine learning algorithms), or be any other suitable set of machine learning algorithms.

The event can be categorized with the category in response to the category probability exceeding a category probability threshold. The category probability threshold can be predetermined (e.g., received from a user), automatically determined (e.g., using machine learning techniques), dynamically determined (e.g., based on frequency of event categorization with the category, etc.), or otherwise determined. However, the event can be categorized in any other suitable manner. The set of machine learning algorithms determining the equation can be the same set of machine learning algorithms used to determine the second subset of features or determine the category probability, but can alternatively be a different set of machine learning algorithms (e.g., third set of machine learning algorithms), or be any other suitable set of machine learning algorithms.

Multiple category probabilities can be determined for an event. The categories associated with the event can be substantially static or vary as a function of time, feature value, or any other suitable parameter. For example, an event can be initially categorized as a local event, and recategorized or additionally categorized as a national event when the acceleration of global popularity and/or spread exceeds a threshold acceleration. Each event can be associated with a single category, multiple categories, or any suitable number of categories. When the event can only be associated with a single category, the category having the highest category probability is preferably associated with the event. However, any other suitable category can be associated with the event.

The method can additionally include determining the geographic extent of the event S600, which functions to determine the geographic region corresponding to the event. Determining the geographic extent of the event can additionally or alternatively function to provide a different set of content (e.g., second content plurality) that can be used to determine the feature values. Determining the geographic extent of the event can be particularly useful if the method monitors multiple non-overlapping geofences instead of monitoring multiple overlapping geofences. Determining the geographic extent of the event S600 can include detecting events within a first and second geofence S620, determining that the events are a common event S640, and determining a third geofence enclosing the first and second geofences in response to determination that the events are a common event S660. However, the geographic extent can be determined in any other suitable manner.

The events within the first and second geofence are preferably detected in the manner discussed above, but can alternatively be determined in any other suitable manner. In one variation, a first event is detected in the first geofence based on values for a first set of features, while the second event is detected in the second geofence based on values for a second set of features different from the first set, wherein the feature sets associated with the first and second geofences can be determined based on historical events and/or feature values associated with the respective geofence. In a second variation, the first and second events can be detected in the first and second geofences based on values of the same set of features. However, the events can be otherwise detected. The first and second geofences preferably represent geographically adjacent geographic regions, but can alternatively represent geographically distant geographic regions. Geographically adjacent geographic regions can be contiguous regions (e.g., wherein the first and second geofences share a border), cornerwise regions (e.g., cornerwise geofences), geographic regions within a predetermined geographic distance, geofences within a predetermined number of geofences apart, geographic regions on a contiguous land mass, or be otherwise geographically adjacent. Geographically distant geographic regions can be separated by a predetermined geographic distance (e.g., by a predetermined number of geofences), by a physical barrier (e.g., a wall, such as the Great Wall of China, a water body, etc.), or be otherwise geographically distant. The events can be concurrently detected in the first and second geofence, be detected within a predetermined time of each other (e.g., received from a user, learned, etc.), such as within 30 minutes of each other, or be related temporally in any other suitable manner.

Determining that the first event and the second event are a common event S640 functions to determine whether the third geofence should be determined. A common event determination module of the event detection system preferably determines whether the first and second events are a common event, but any other suitable system can alternatively make the determination. The first and second events are preferably a common event when the events are the same event (e.g., the same baseball game is occurring in both geofences), but can alternatively be common events when the events are related, or be considered common events based on any other shared feature. The first and second geofences are preferably both event nexus, but can alternatively be any other suitable geofence.

In a first variation, the first and second events can be common events when all or a subset of the feature values substantially match (e.g., are within a predetermined threshold difference of each other). For example, the first and second events can be considered common events when they are substantially concurrently detected, include substantially similar subject matter, have substantially similar content post frequencies, have substantially similar labels, or share any other suitable feature value.

In a second variation, the first and second events can be common events when the content has substantially the same parameters (e.g., content information) and/or are originally generated (e.g., unique compared to the rest of the content plurality or the content of other geofences). For example, events occurring at a first and second geofence can be considered a common event when both geofences are associated with originally generated videos or images sharing common subject matter (e.g., a concert), while a third event detected in a third geofence is not considered a common event with the first and second events when the third event was primarily detected based on copied content (e.g., reposts, references, etc.).

In a third variation, the first and second events can be considered a common event when the respective first and second geofence have a predetermined association. For example, the first and second geofence can represent geographic regions located within a common venue (e.g., stadium), or be associated with a common venue (e.g., represent a stadium and a parking lot for the stadium, respectively).

In a fourth variation, whether the first and second events are a common event can be determined using machine learning techniques to determine a probability of event commonality, wherein the events can be considered a common event in response to the commonality probability exceeding a threshold probability. However, whether the first and second events are a common event can be otherwise determined.

Determining a third geofence enclosing the first and second geofences S660 functions to determine the geographic region associated with the event. The third geofence is preferably subsequently stored in association with the event. Alternatively, the event can be stored in association with the third geofence, stored in association with the constituent geofences within the third geofence, or the association can be stored in any other suitable manner. The third geofence preferably encloses the entirety of the first and second geofences, but can alternatively enclose a portion of the first and second geofences. Determining the third geofence can additionally function to determine which geographic identifier (e.g., which level of geographic abstraction) should be associated with the event. The third geofence is preferably determined in response to determination that the first event and the second event are a common event, but can alternatively be determined at any other time.

In a first variation, the third geofence can be determined in the manner disclosed in Ser. No. 14/501,436, filed 30 Sep. 2014 and incorporated herein in its entirety by this reference.

In a second variation, the third geofence can be determined based on geofence event probabilities, wherein the third geofence can enclose geofences having event probabilities above a threshold event probability (e.g., the same as or different from that used to determine whether an event was occurring in the respective geofence). In a specific example, the boundaries or anchor points of the third geofence can be determined based on the geofence boundaries separating geofences having event probabilities above the threshold event probability and geofences having event probabilities below the threshold event probability.

In a third variation, the third geofence can be determined based on the respective feature values of the encompassed geofences, such as content posting frequency, wherein the third geofence borders can be determined in substantially the same manner as the second variation. The feature values can be feature values generated from the content plurality, from historical content (e.g., content outside of the content plurality and/or unassociated with the event), or from any other suitable set of content.

In a fourth variation, the third geofence can be determined based on the resultant plurality of content within the third geofence. In particular, the third geofence can be determined based on the event probability for the third geofence (third event probability), wherein the third event probability can be determined based on the plurality of content associated with the third geofence. The third geofence is preferably determined when the associated event probability exceeds a threshold event probability (e.g., the same as or different from that used to determine whether an event was occurring in the respective geofence), but can be determined in any other suitable manner. In this variation, the third geofence can be recursively determined wherein the boundaries can be selected, the associated content plurality determined, the event probability calculated, and new boundaries selected in response to the event probability falling below the event probability threshold. However, the third geofence can be otherwise determined.

Determining the geographic extent of the event Shoo can additionally include determining a geographic identifier for the third geofence, such that the geographic identifier can be associated with the common event. The geographic identifier can be determined in response to determination of the third geofence or be determined at any other suitable time. The geographic identifier can be a venue included in a threshold proportion of the constituent geofences, a political region included within the third geofence, a political region mostly covered by the third geofence (e.g., wherein the third geofence covers at least a threshold proportion of the political region), a venue name extracted from the content of the plurality, a keyword extracted from the content, or be any other suitable identifier identified in any other suitable manner.

The method can additionally include detecting the end of an event. The end of the event can be detected when the event probability (e.g., second event probability) falls below an event probability threshold (e.g., the same as or different event probability threshold from that used to determine whether an event was occurring in the respective geofence), when a feature value pattern is detected, when a feature value surpasses a predetermined value threshold, or be determined in any other suitable manner.

The method can additionally or alternatively include differentiating between the end of an event and a dip in the generated content, which can additionally function to bridge the dip in event probability during an intermission in the event. In this variation, features differentiating event endings and event intermissions can be analyzed in response to detection of an event dip. The probability can be artificially maintained at the threshold probability in response to categorization that the event is in an intermission and has not ended. In one example, an event end can be detected in response to a ratio of scores being posted relative to the entirety of the subject matter increasing prior to the dip, while an event intermission can be detected in response to the ratio scores relative to the entirety of the subject matter remaining within a threshold percentage of a secondary subject matter ratio.

Figure 18:
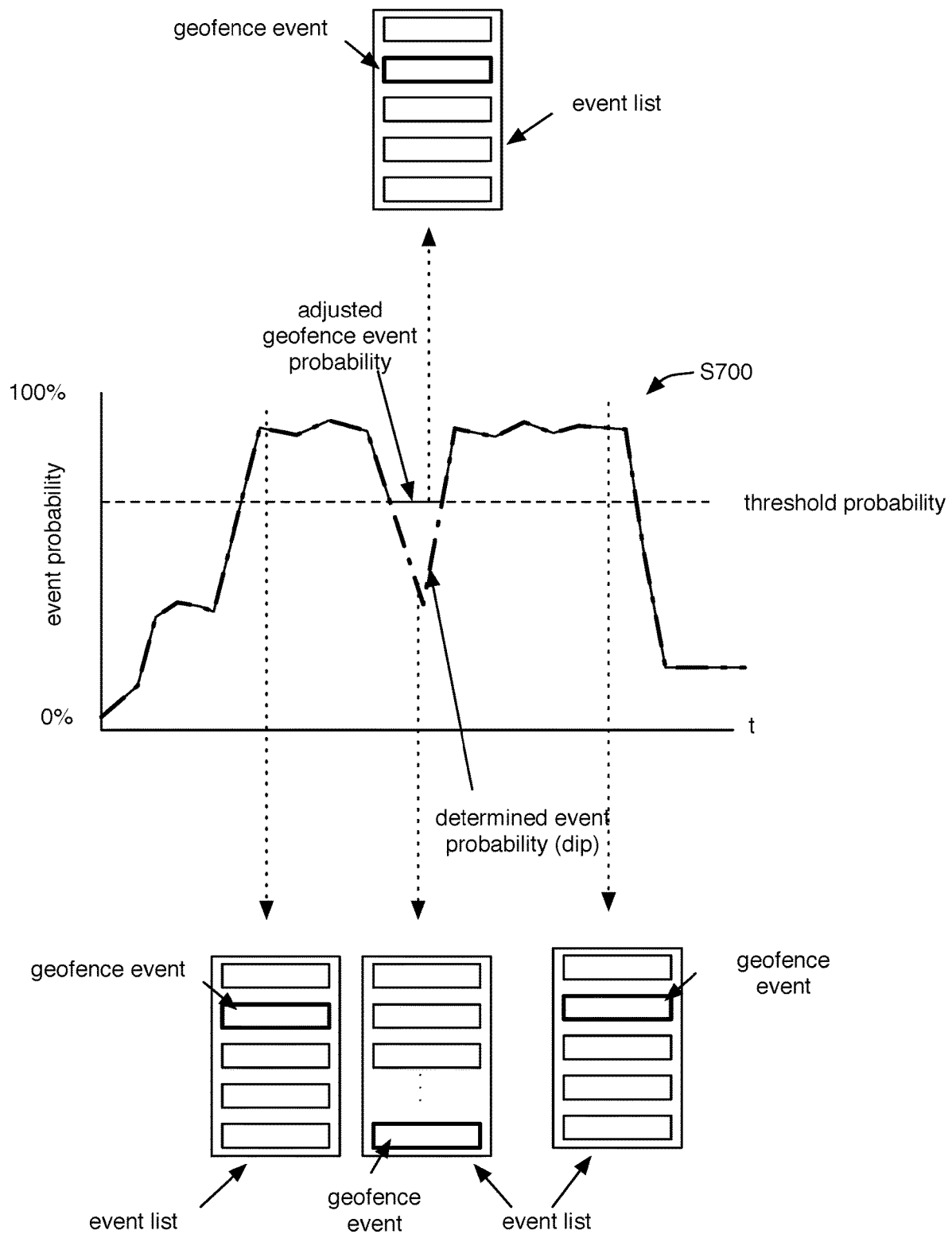
FIG. 18 is a schematic representation of artificially maintaining the threshold event probability.
Figure 19:
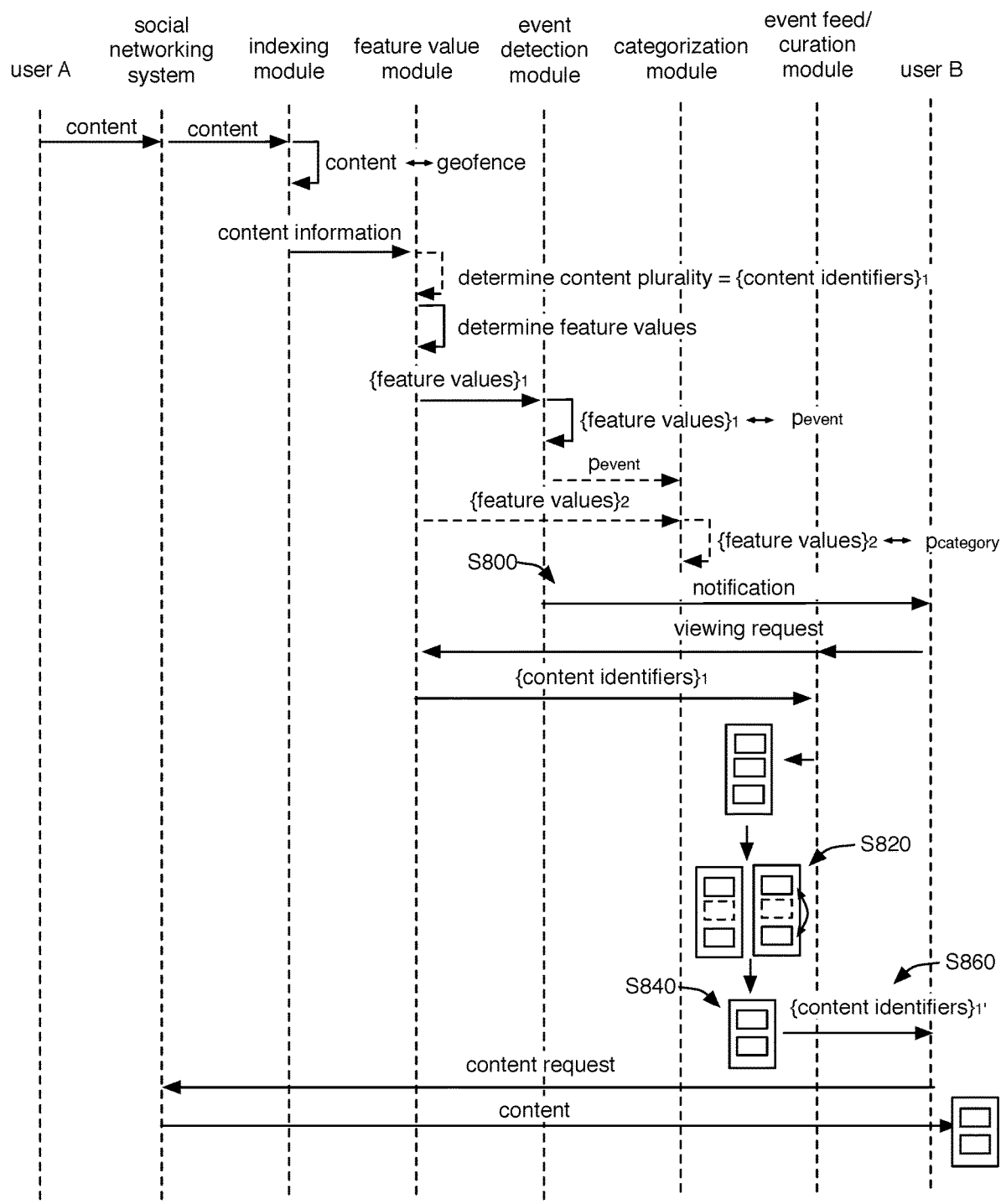
FIG. 19 is a schematic representation of an example of user account interaction with the event detection system.
Figure 20:
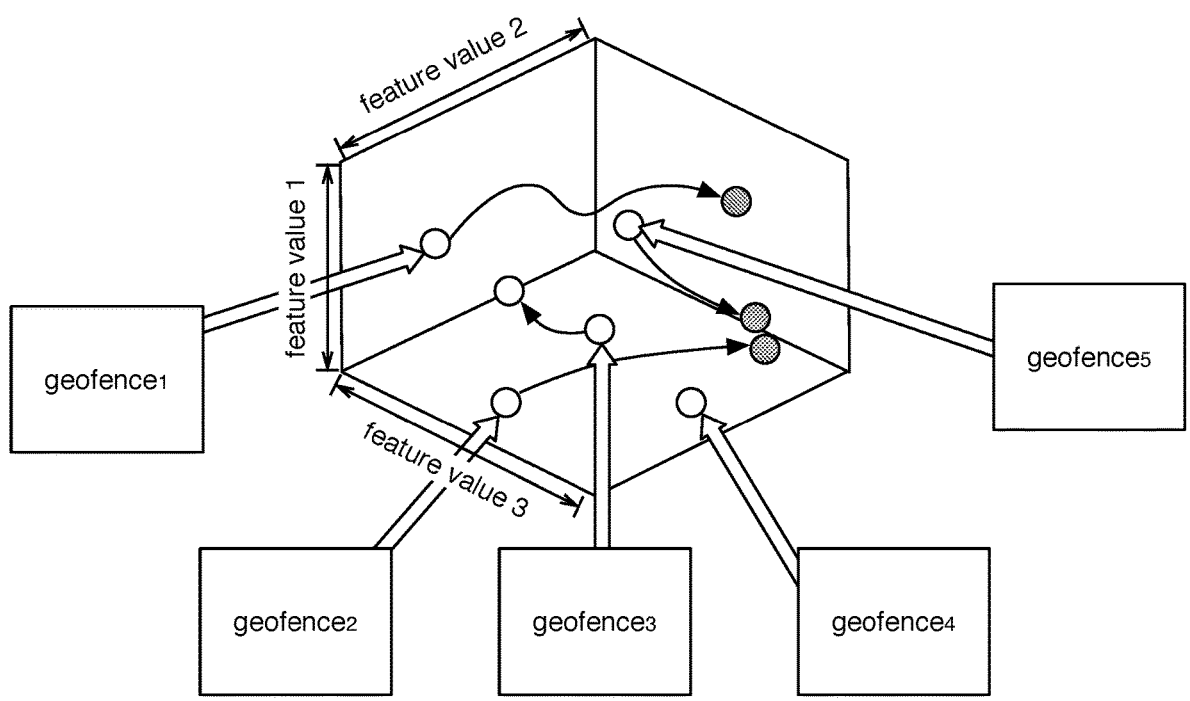
FIG. 20 is a schematic representation of a hyper-dimensional space representative of a set of feature values, wherein each geofence can be associated with an imaginary geofence location within the space based on the feature values associated with the geofence; wherein each geofence can be associated with a typical location and/or region within the space representative of baseline or typical content for the geofence (unshaded circles), wherein an event can be determined in response to the imaginary geofence location moving beyond a threshold distance, moving in a given direction or pattern of directions, or moving within the space in any other suitable manner (shaded circles).

The method can additionally include artificially maintaining an event probability above a threshold level S700, which functions to prevent probability dips in an event from registering as two events in the system when the event probability is used to determine the beginning and ending timestamps of the event. This can be particularly useful for scheduled events in which there is an intermission or halftime when user content generation about the event tends to drop (e.g., due to the user shifting focus to other subject matter, shifting to a non-content-generating register such as going to get food, etc.). The event probability is preferably artificially maintained at or above a threshold level for certain types of events, such as scheduled events (e.g., wherein the event is verified by external schedule) or events falling within a predetermined set of categories, but can alternatively be applied to any type of event. The event probability dip is preferably still detected, but is artificially filled in for event presentation purposes (e.g., listing purposes), as shown in FIG. 18. Artificially maintaining an event probability above a threshold level preferably includes artificially holding the event probability at a threshold probability for a threshold period of time after a potential event end is detected (e.g., after a probability dip), but can be alternatively maintained. The threshold probability is preferably selected to promote the event within an on-going event listing (e.g., as shown in FIG. 7), but can be determined in any other suitable manner. The threshold time can be determined based on the maximum content volume for the event within the geofence, average content volume for the event within the geofence during a predetermined time period prior to probability dip, typical dip duration for the event type, type of event, types of persona at the event, types of persona typically within the geofence, or any other suitable feature. In one example, in response to the event being categorized as a soccer game, the threshold time period can be substantially equal to or longer than the halftime duration. The number of times the event probability is artificially maintained can additionally or alternatively be limited, wherein the number of times the event probability is artificially maintained can be selected based on one or more of the features discussed above, or based on any suitable feature. In one example, in response to the event being categorized as a soccer game, the event probability can be artificially maintained once during the event to accommodate for the halftime. In a second example, in response to the event being categorized as a football game, the event probability can be artificially maintained 6 times to accommodate for time-outs. However, the number of times the probability can be artificially maintained can be unlimited or otherwise restricted. However, the event probability can be otherwise artificially adjusted.

The method can additionally include weighting the event probability for user presentation. When a list of probable events is presented to a user, the event probabilities tend to fall along a continuum. Even when the events are arranged in decreasing order based on the respective probabilities, it is difficult for a user viewing the list to distinguish between the events of importance and the events that are unimportant. In other words, because the event probabilities fall along a continuum, the user does not know what the cutoff probability should be. In one variation of the method, the event probabilities can be selectively weighted, wherein events having a probability above a threshold probability can be unweighted or positively weighted (e.g., with a weight of 1 or more), and events having a probability below a threshold probability can be negatively weighted (e.g., with a weight below 1). The threshold probability is preferably 0.5 (50%), but can alternatively be any other suitable threshold probability. In another variation of the method, probabilities for events having certain categorizations (e.g., conflict, fight) can be promoted (e.g., for a security monitoring application), while probabilities for events having other categorizations (e.g., "party") can be discounted. However, the event probability can be adjusted in any other suitable manner.

The method can additionally include sending a content feed for the event to a remote user device S800. Sending the content feed can include selecting content for inclusion in the content feed S820, aggregating the selected content into a content feed S840, and sending the content feed to the remote user device S860. The content feed can be sent in response to receipt of a request for the content feed associated with the event, in response to receipt of an event selection, or in response to any other suitable sending event.

Selecting content for inclusion in the content feed S820 functions to curate the content plurality and reduce the volume of content presented to the user. The content to be curated and included in the content feed is preferably content from the plurality of content, but can alternatively be content associated with the geofence, content associated with the event, or any other suitable content. The set of content is preferably curated after event feed aggregation, before event feed display to the user, but can alternatively be curated at any other suitable point in the method. The set of content is preferably automatically curated, but can alternatively be manually curated. In one variation, content focused on the event focus are preferably retained while content focused on event attendees, participants, or bystanders are preferably removed from event feed. The content focus can be determined from metadata associated with the content, image analysis, content analysis, NLP, sentiment analysis, hashtags, explicit references (e.g., links) in the content, or through any other suitable method. For example, content having content that was generated by the front facing camera of a mobile device can be automatically discarded, while content having content that was generated by the back facing camera can be included. In a second variation, the event feed can be curated based on the content type. For example, content including images and/or video can be retained while content including only text can be removed. In a third variation, selecting content for content feed inclusion can include selecting content satisfying a set of conditions, such as media type conditions (e.g., wherein only images or videos are selected), security setting conditions (e.g., wherein only public content is selected), user-specific conditions (e.g., wherein the content feed can include content generated by user accounts connected to the user account associated with the remote device), content parameter conditions (e.g., wherein only content having more than a threshold number of views are selected), feature values (e.g., wherein content contributing heavily to the event detection are selected), or selecting content satisfying any other suitable set of conditions. The content can be selected based on the content information stored in the content index, but can alternatively be selected based on the content itself, or selected in any other suitable manner. Alternatively, the event feed can remain uncurated, or be curated in any other suitable manner.

Curating the set of content can additionally include ordering the content within the feed, which can function to guide a user through an event. In one variation of the method, ordering the content can include ordering the content according to the time that the content was generated (e.g., the time the photograph was taken). In real-time feed generation, the new content can be included in the event feed if the generation time of the content is included in the plurality (e.g., within an inclusion time threshold of the substantially instantaneous time or within an inclusion time threshold of the generation time of the last content included in the feed). The new content can be excluded from the event feed if the generation time of the content is outside of the inclusion time threshold of the substantially instantaneous time. In a second variation of the method, ordering the content can include ordering the content according to location (e.g., along a path through the geographic region). For example, in an awards show, the event focus will travel from the curbside, down the red carpet, and into the concert hall. This progression over location and time within the geographic region will be reflected by the path traced by the highest content density over time, and the content can be ordered based on the path progress (e.g., with content taken at the curbside ordered first, and content taken within the hall ordered last within the feed). However, the set of content can be ordered in any other suitable manner. Furthermore, the set of content can be curated using machine learning algorithms to enable automatic feed creation or in any other suitable manner.

Aggregating the selected content into a content feed S840 can include aggregating the content into the content feed, the media of the content into the content feed, the content identifiers for the content into the content feed, or aggregating any other suitable content information into the content feed.

Sending the content feed to the remote user device S860 can include sending the content to the remote user device, sending the content identifiers to the remote user device, or sending any other suitable content information to the remote user device. When a list of content identifiers are sent to the remote user device, the remote user device can retrieve the content from the source social networking system based on the unique content identifier and populate the content feed based on the retrieved content. However, the content feed can be otherwise sent to the remote user device.

The method can additionally include sending a notification about the event to an entity, in response to event detection. The notification can be selectively sent to entities based on the associated event category, geographic region associated with the geofence, or based on any other suitable parameter. In one variation, the notification or event can be sent to a first entity (e.g., endpoint) in response to the first category probability exceeding the first category probability threshold, and the notification or event can be sent to a second entity (e.g., endpoint) in response to a second category probability exceeding the second category probability threshold. The first and second entities are preferably different entities, but can alternatively be the same entity. When an event is categorized as a first category, the event is preferably sent to entities associated with the first category but not entities associated with the second category, and when the event is categorized as the second category, the event is preferably sent to entities associated with the second category but not entities associated with the first category. However, the event can be sent to any other suitable entity, whether or not they are associated with the determined category. In one example, events categorized as news can be sent to news entities, while events categorized as security violations can be sent to security personnel. In another example, when the event is associated with both a news and a security violation category, notifications for the same event can be sent to both news sources and security personnel.

The method can additionally include storing the event identifier and associated feature values in association with the geofence, such that the event identifier and underlying feature values are persistent, even if the content from which the feature values were determined is removed from the social networking system or otherwise inaccessible. The content identifiers of the underlying content plurality can additionally be stored in association with the event identifier. The event detection system preferably stores the event identifier and associated information, but another system (e.g., a social networking system, etc.) can alternatively store the event identifier and associated information.

An alternative embodiment preferably implements the above methods in a computer-readable medium storing computer-readable instructions. The instructions are preferably executed by computer-executable components preferably integrated with an event detection system. The event detection system can include an event probability module configured to determine the probability that an event was occurring within a geofence at the time of content generation or posting based the values for a first set of features determined based on geofence content, a classification module configured to determine a set of labels or classifications for an event based on the geofence content, and a post-processing module configured to resolve label conflicts and/or determine whether the event would be of interest to an entity based on a second set of features. The computer-readable medium may be stored on any suitable computer readable media such as RAMs, ROMs, flash memory, EEPROMs, optical devices (CD or DVD), hard drives, floppy drives, or any suitable device. The computer-executable component is preferably a processor but the instructions may alternatively or additionally be executed by any suitable dedicated hardware device.

Although omitted for conciseness, the preferred embodiments include every combination and permutation of the various system components and the various method processes.

As a person skilled in the art will recognize from the previous detailed description and from the figures and claims, modifications and changes can be made to the preferred embodiments of the invention without departing from the scope of this invention defined in the following claims.

We claim:

1. A method for dynamic event extent determination, comprising:
    receiving content from a set of social networking systems;
    identifying a plurality of content, from the received content, associated with a geofence;
    determining a plurality of feature values from the plurality of content;
    reducing the plurality of feature values to a reduced plurality of feature values based on an event detection model;
    using the event detection model, automatically detecting an event within a geofence of the plurality of geofences based on the reduced plurality of feature values;
    in response to detecting the event within the geofence:
        including the geofence in an event region associated with the event;
        determining a geographic extent of the event region, comprising iteratively:
            identifying a proximal geofence from among a plurality proximal geofences located proximal the geofence;
            analyzing the proximal geofence for the event based on the reduced plurality of feature values; and
            in response to detecting the event in the proximal geofence, including the proximal geofence in the event region;
    detecting an event termination based on another set of feature values from among the plurality of feature values; and
    associating the event region with the detected event.

2. The method of claim 1, further comprising determining a baseline value for a feature from historic content associated with each geofence of the plurality;
    wherein automatically detecting the event comprises:
        detecting the event in response to the feature value for the feature deviating from the baseline value for the geofence.

3. The method of claim 2, wherein the baseline value comprises a baseline feature frequency for the respective geofence, wherein detecting the event comprises detecting the event in response to the feature frequency exceeding the baseline feature frequency.

4. The method of claim 3, wherein the content comprises posts, wherein the baseline feature frequency comprises a baseline posting frequency for the respective geofence, wherein detecting the event comprises detecting the event in response to the posting frequency within the geofence exceeding the baseline posting frequency for the geofence.

5. The method of claim 3, wherein the baseline feature frequency comprises a baseline keyword frequency for the respective geofence, wherein detecting the event comprises detecting the event in response to a keyword frequency within the geofence exceeding the baseline keyword frequency for the geofence by a predetermined amount.

6. The method of claim 5, wherein the predetermined amount for the proximal geofence is determined based on a size of the event region.

7. The method of claim 1, wherein each geofence of the plurality of geofences represents a different physical region, each physical region having a common unit area.

8. The method of claim 1, wherein the proximal geofence is contiguous with the geofence within the event region.

9. The method of claim 1,
    wherein reducing the plurality of feature values comprises aggregating the selected content into a content feed; and further comprising sending the content feed, in association with an identifier for the event region, to a remote user device.

10. The method of claim 9, wherein aggregating the selected content into a content feed is repeatedly performed as new content is received from the set of social networking systems; and
in response to detecting the event termination, ceasing content selection associated with the event.

11. The method of claim 10, wherein detecting the event termination comprises:
determining an event probability from the second set of feature values; and
detecting the event termination in response to determination of the event probability falling below a threshold event probability.

12. The method of claim 11, further comprising maintaining the event probability for a predetermined period of time after determination that the event probability fell below the threshold event probability.

13. A method for dynamic event extent determination, comprising:
for each of the plurality of geofences, determining a baseline value for a feature from historic content associated with each geofence of the plurality;
receiving content from a set of social networking systems;
for each of a plurality of geofences:
identifying a plurality of content associated with the geofence; and
determining a feature value for the feature from the plurality of content;
detecting a first event within a first geofence of the plurality in response to the feature value deviating from the baseline value for the first geofence;
within a predetermined time window of detecting the first event, detecting a second event within a second geofence of the plurality in response to the feature value deviating from the baseline value for the second geofence;
determining that the first and second event are a common event;
determining a third geofence encompassing the first and second geofences; and
associating the third geofence with the common event;
selecting content associated with the common event from the plurality of content;
aggregating the selected content into a content feed;
sending the content feed, in association with an identifier for the event region, to a remote user device in response to receipt of a request from the remote user device;
receiving new content from the set of social networking systems;
after detecting the first and second events within the first and second geofences, respectively:
determining a second set of feature values for the third geofence from the new content;
detecting an event termination based on the second set of feature values; and
ceasing content selection associated with the event.

14. The method of claim 13, wherein the baseline value comprises a baseline keyword frequency for the respective geofence, wherein detecting the event comprises detecting the event in response to a keyword frequency exceeding the baseline keyword frequency by a predetermined amount.

15. The method of claim 13, wherein the content comprises posts, wherein the baseline value comprises a baseline posting frequency for the respective geofence, wherein detecting the event comprises detecting the event in response to the posting frequency within the geofence exceeding the baseline posting frequency for the geofence.

16. The method of claim 13, further comprising categorizing the first and second events with event categories, based on the respective feature values.

17. The method of claim 16, wherein determining that the first and second event are a common event comprises determining that the first and second events are categorized with a common event category.

18. The method of claim 13, wherein detecting the event termination comprises:
determining an event probability from the second set of feature values; and
detecting the event termination in response to determination of the event probability falling below a threshold event probability.

19. The method of claim 18, further comprising maintaining the event probability for a predetermined period of time after determination that the event probability fell below the threshold event probability.

\* \* \* \* \*